(12) United States Patent
Adachi et al.

(10) Patent No.: US 8,546,685 B2
(45) Date of Patent: Oct. 1, 2013

(54) CRYSTALLINE SILICON BASED SOLAR CELL AND METHOD FOR MANUFACTURING THEREOF

(75) Inventors: Daisuke Adachi, Settsu (JP); Kunta Yoshikawa, Settsu (JP); Kenji Yamamoto, Settsu (JP)

(73) Assignee: Kaneka Corporation, Osaka-shi (JP)

(*) Notice: Subject to any disclaimer, the term of this patent is extended or adjusted under 35 U.S.C. 154(b) by 118 days.

(21) Appl. No.: 13/381,610

(22) PCT Filed: Jul. 2, 2010

(86) PCT No.: PCT/JP2010/061343
§ 371 (c)(1),
(2), (4) Date: Dec. 29, 2011

(87) PCT Pub. No.: WO2011/002086
PCT Pub. Date: Jan. 6, 2011

(65) Prior Publication Data
US 2012/0097244 A1  Apr. 26, 2012

(30) Foreign Application Priority Data

Jul. 3, 2009 (JP) ................ 2009-159205
Oct. 19, 2009 (JP) ................ 2009-240474

(51) Int. Cl.
*H01L 31/00* (2006.01)
*H01L 21/00* (2006.01)

(52) U.S. Cl.
USPC ............ 136/256; 438/69; 438/71; 438/97

(58) Field of Classification Search
USPC .................. 136/256; 438/69, 71, 97
See application file for complete search history.

(56) References Cited

U.S. PATENT DOCUMENTS 5,545,443 A    8/1996   Yamada et al.
5,589,008 A *  12/1996  Keppner ............... 136/259
(Continued)

FOREIGN PATENT DOCUMENTS

JP     4-280975 A    10/1992
JP     8-508368 A     9/1996
(Continued)

OTHER PUBLICATIONS

ISA Japanese Patent Office, International Search Report of PCT/JP2010/061343, Oct. 5, 2010, 2 pages.
(Continued)

*Primary Examiner* — Eli Mekhlin
(74) *Attorney, Agent, or Firm* — Alleman Hall McCoy Russell & Tuttle LLP

(57) ABSTRACT

Provided is a hetero-junction solar cell with a silicon crystalline substrate of small thickness but exhibiting less warpage, and having a high photoelectric conversion efficiency. The crystalline silicon substrate has a thickness of 50 μm to 200 μm, and has a rough structure on the light-incident-side surface thereof. The surface of the transparent conductive layer in the light incidence side has an irregular structure. The top-bottom distance in the irregular structure of the transparent conductive layer in the light-incidence-side is preferably smaller than the top-bottom distance in the rough structure of the crystalline silicon substrate in the-light-incidence side. The distance between tops of the projections in the irregular structure on the surface of the transparent conductive layer in the light incidence side is preferably smaller than the distance between tops of the projections in the rough structure on the surface of the crystalline silicon substrate in the light incidence side.

11 Claims, 6 Drawing Sheets

(56) References Cited

U.S. PATENT DOCUMENTS

| | | | |
|---|---|---|---|
| 6,030,886 A * | 2/2000 | Yuri et al. | 438/493 |
| 2008/0032044 A1 | 2/2008 | Kuriyagawa et al. | |
| 2008/0295886 A1 * | 12/2008 | Hu et al. | 136/256 |

FOREIGN PATENT DOCUMENTS

| | | |
|---|---|---|
| JP | 10135497 A | 5/1998 |
| JP | 2000-252501 A | 9/2000 |
| JP | 2001085722 A | 3/2001 |
| JP | 2004-311704 A | 11/2004 |
| JP | 2005-260150 A | 9/2005 |
| JP | 4152197 B2 | 9/2008 |
| WO | 2006070799 A1 | 7/2006 |

OTHER PUBLICATIONS

International Bureau of WIPO, Translation of the International Preliminary Report on Patentability of PCT/JP2010/061343, Feb. 23, 2012, WIPO, 6 pages.

* cited by examiner

CRYSTALLINE SILICON BASED SOLAR CELL AND METHOD FOR MANUFACTURING THEREOF

TECHNICAL FIELD

The invention relates to a crystalline silicon based solar cell having a heterojunction on a semiconductor substrate surface.

BACKGROUND ART

Crystalline silicon based solar cells having a crystalline silicon substrate are high in photoelectric conversion efficiency, so that the cells have already been used widely and generally as a solar light power generation system. Of the solar cells, the following cell is in particular called a heterojunction solar cell: a crystalline silicon based solar cell wherein an amorphous silicon based thin film having a band gap different from that of monocrystalline silicon is formed on a surface of a crystalline silicon substrate so that a diffusion potential is produced. The heterojunction solar cell, wherein a thin and intrinsic (i-type) amorphous silicon layer is interposed between the conductivity-type amorphous silicon based thin film formed for producing the diffusion potential, and the crystalline silicon, is known as one crystalline silicon based solar cell with the highest conversion efficiency. In this form of solar cell, defects present in the surface of the crystalline silicon substrate are passivated due to the thin i-type amorphous silicon layer. Moreover, the solar cell has the i-type amorphous silicon layer, so that, at the time of forming the conductivity type amorphous silicon based thin film, a carrier-introduction impurity is prevented from diffusing the surface of the crystalline silicon (see Patent Document 1).

Electric current generated by photoelectric conversion is taken to the outside of the cell through its electrodes. The electrodes generally consist of a combination of a transparent conductive layer with a collector electrode. The transparent conductive layer preferably has an optical thickness ([refractive index]×[thickness]) of about ¼ of a wavelength of 300 to 1200 nm, which can be absorbed by monocrystalline silicon. In general, a tin-doped indium oxide (ITO) having a thickness of about 100 nm is widely used as the transparent conductive layer. According to this structure, the transparent conductive layer functions as an anti-reflecting layer by interference of interfacially reflected light on the transparent conductive layer. Thus, the solar cell is made high in light uptake efficiency so that the cell can be improved in photoelectric conversion efficiency.

For the collector electrode, a material such as an Ag paste is used. Such a collector electrode is opaque; thus, in order to enlarge the light-receiving area of the solar cell, at least the collector electrode at the light-incident-side of the cell is patterned into the form of lines by screen printing or some other. This collector electrode is easily peeled from the transparent conductive layer. The peel of the collector electrode is a fatal defect for the operation of the solar cell. For this reason, attempts at improving the adhesive strength between the transparent conductive layer and the collector electrode have been most actively made at present (see, for example, Patent Document 2).

PRIOR ART DOCUMENTS

Patent Documents

Patent Document 1: Japanese Patent No. 4152197
Patent Document 2: Japanese Unexamined Patent Application Publication No. 2005-260150

SUMMARY OF THE INVENTION

Problems to be Solved by the Invention

The heterojunction solar cell as described above has a high photoelectric conversion efficiency while the solar cell has a problem related to costs since a silicon monocrystalline substrate is used. In recent years, there has been generated a tendency towards a short supply of crystalline silicon substrates. Also from this viewpoint, a necessity of decreasing the thickness of any crystalline silicon substrate has been increased.

In the meantime, the inventors' investigations have revealed that when a thickness of a silicon substrate used in a heterojunction solar cell is smaller, a heterojunction solar cell becomes larger in warpage after electrodes are formed so that a problem arises, in that the cell has lower productivity, and may be cracked. Furthermore, crystalline silicon is small in absorption coefficient at long wavelengths (in the infrared range); thus, when the thickness of the silicon substrate is 200 μm or less, in particular, 150 μm or less, the substrate cannot completely absorb light having long wavelengths. Thus, the substrate suffers from the problem of being low in photoelectric conversion characteristics, in particular, in short circuit current density (Jsc).

In light of the above, an object of the invention is to provide a heterojunction solar cell about which, even when its silicon crystalline substrate is small in thickness, the substrate is inhibited from being warped, and further a high photoelectric conversion efficiency is attained.

Means for Solving the Problems

The inventors have made diligent investigations in light of these problems to discover that even when a silicone crystalline substrate is small in thickness, a solar cell may be yielded wherein the substrate is inhibited from being warped and high photoelectric conversion characteristics are attained by forming a zinc oxide layer having, in a surface thereof, an irregular structure as a light-incident-side transparent conductive layer.

The invention relates to a crystalline silicon based solar cell including: a crystalline silicon substrate 1 of one conductivity type; a light-incident-side i-type silicon based thin film layer 2, a silicon based thin film layer 3 of an opposite conductivity type, a light-incident-side transparent conductive layer 4, and a collector electrode 5 that are formed over a light-incident-side main surface of the substrate, in this order from the crystalline silicon substrate 1 side; and a back-side i-type silicon based thin film layer 6, a silicon based thin film layer 7 of the one conductivity type, a back-side transparent conductive layer 8, and a metal electrode layer 8 that are formed over the other main surface of the crystalline silicon substrate, in this order from the crystalline silicon substrate 1 side. The crystalline silicon substrate 1 has a thickness of 50 to 200 μm, and has a rough structure in at least the light-incident-side main surface thereof. The light-incident-side surface of the light-incident-side transparent conductive layer 4 has an irregular structure, and the top-bottom distance H2 of the irregular structure of the light-incident-side transparent conductive layer 4 is smaller than top-bottom distance H1 of the light-incident-side rough structure of the crystalline silicon substrate 1. Moreover, the apex distance L2 between tops of the irregular structure in the light-incident-side transparent conductive layer 4 is smaller than that L1 of the light-incident-side irregular structure of the crystalline silicon substrate 1.

The top-bottom distance H2 of the irregular structure of the light-incident-side transparent conductive layer 4 is preferably from 20 to 250 nm. The top-bottom distance H1 of the light-incident-side rough structure of the crystalline silicon substrate 1 is preferably from 0.5 μm to 40 μm.

The light-incident-side transparent conductive layer 4 has a zinc oxide layer having a thickness of 300 to 2500 nm. It is preferred that the zinc oxide layer includes hexagonal zinc oxide preferentially oriented along a (10-10) plane direction, a (11-20) plane direction, or a (10-11) plane direction, and the hexagonal zinc oxide has a lattice constant in the ranges from 0.3225 to 0.3246 nm along the a-axis.

The stress strain parameter S of the zinc oxide layer, which is equal to $(a_{ZnO}-0.3249) \times d_{ZnO}$, is preferably from 0.3 to 2.9 nm$^2$. The warp amount parameter W of the zinc oxide layer, which is equal to $(a_{ZnO}-0.3249) \times d_{ZnO}/d_{Si}$, is preferably from $0.3 \times 10^{-5}$ to $2.9 \times 10^{-5}$ nm. Herein, $a_{ZnO}$ represents the lattice constant (units; nm) along the a-axis of the zinc oxide; $d_{ZnO}$ represents the thickness (units; nm) of the zinc oxide layer; and $d_{Si}$ represents the thickness (units; nm) of the silicon substrate.

The impurity concentration in the crystalline silicon substrate side of the zinc oxide layer is preferably lower than that in the opposite side of the crystalline silicon substrate side of the zinc oxide layer. The carrier density of the zinc oxide layer is preferably from $3 \times 10^{19}$ to $2.5 \times 10^{20}$ cm$^{-3}$.

Furthermore, the invention relates to a method for manufacturing a crystalline silicon based solar cell.

The manufacturing method of the invention includes: a silicon substrate preparing step of preparing a silicon crystalline substrate 1 of one-conductivity-type having a thickness of 50 to 200 μm and having a rough structure at least one main surface thereof; a light-incident-side silicon based thin film deposition step of forming a light-incident-side i-type silicon based thin film layer 2 and a silicon based thin film layer 3 of an opposite-conductivity-type in this order over the surface of the silicon crystalline substrate 1 in which the rough structure is formed; a back-side silicon based thin film layer forming step of forming a back-side i-type silicon based thin film layer 6 and a silicon based thin film layer 7 of the one-conductivity-type in this order, over the other surface of the silicon crystalline substrate 1; a light-incident-side transparent conductive layer forming step of forming a light-incident-side transparent conductive layer 4 over the opposite-conductivity-type silicon based thin film layer 3 side surface of the present workpiece; a back-side transparent conductive layer forming step of forming a back-side transparent conductive layer 8 over the one-conductivity-type silicon based thin film layer 7 side surface of the workpiece; a collector electrode forming step of forming a collector electrode 5 over the light-incident-side transparent conductive layer 4 side surface of the workpiece; and a metal electrode layer forming step of forming a metal electrode layer 10 over the back-side transparent conductive layer 8 side surface of the workpiece.

In the light-incident-side transparent conductive layer forming step, plural layers may be formed. Preferably, a zinc oxide layer having a thickness of 300 to 2500 nm is formed over at least the collector electrode 5 side surface of the light-incident-side transparent conductive layer 4 by thermal CVD. The deposition temperature for the zinc oxide layer by the thermal CVD preferably includes a range of 120 to 240° C., and more preferably includes a range of 130 to 180° C. In this way, the zinc oxide layer is formed by the thermal CVD, thereby forming a transparent conductive layer having crystal properties as described above and having a fine irregular structure in a surface thereof.

An embodiment of the manufacturing method of the invention further includes a zinc oxide layer annealing step after the zinc oxide layer is formed by the thermal CVD in the light-incident-side transparent conductive layer forming step. In the zinc oxide layer annealing step, the substrate over which the zinc oxide layer is formed is heated to a temperature of 150 to 240° C. In order to set the carrier density in the zinc oxide layer into the above-mentioned range, the annealing step is conducted preferably under reduced pressure, more preferably under vacuum.

Effects of the Invention

In the crystalline silicon based solar cell having the structure of the invention, a zinc oxide layer is used as a light-incident-side transparent conductive layer; thus, shrinkage stress can be caused to act on the light-incident-side of its silicon substrate. For this reason, a balance is attained between the shrinkage stress of a metal electrode layer on the back-side of the silicon substrate and the shrinkage stress based on the zinc oxide layer so that the cell is inhibited from being warped even though the silicon substrate is small in thickness.

Furthermore, the light-incident-side transparent conductive layer has a fine irregular structure in the surface thereof; thus, the optical path length of incident light inside the crystalline silicon substrate is increased by light scattering, and further an anti-reflecting effect is obtained by multiple reflection on the fine irregularities. For this reason, the solar cell is improved in light use efficiency and can realize high photoelectric conversion characteristics. Moreover, the fine irregular structure makes the surface area of the light-incident-side transparent conductive layer large; thus, the adhesive strength between the transparent conductive layer and the collector electrode is made high so that the collector electrode is not easily peeled. As a result, the solar cell yielded is high in reliability.

The solar cell of the invention is small in the thickness of the silicon substrate; thus, the solar cell has the advantages that costs can be decreased and further high mass productivity can be realized. Furthermore, although the silicon substrate is small in thickness, the solar cell can realize photoelectric conversion characteristics equal to or greater than those of any conventional heterojunction solar cell, which has a silicon substrate with a thickness of about 300 μm, since the solar cell includes the zinc oxide layer having a fine irregular structure in its surface and a specific crystal structure as its light-incident-side transparent conductive layer.

DETAILED DESCRIPTION OF THE EMBODIMENTS

The crystalline silicon based solar cell of the invention has a structure, wherein an i-type silicon based thin film layer, a conductivity type silicon based thin film layer, a transparent conductive layer, and an electrode are formed over each of a light-incident-side main surface and a non-light-incident-side main surface, which is opposite to the light-incident-side (referred to as the back-side hereinafter), of a crystalline silicon substrate of one-conductivity-type.

Figure 1:
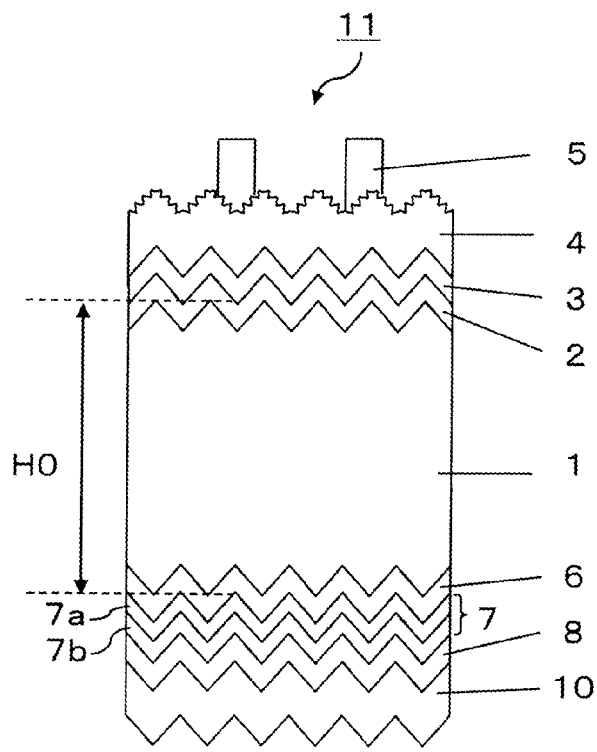
FIG. 1 is a view illustrating a schematic structural section of a crystalline silicon based solar cell according to an embodiment of the invention.

FIG. 1 illustrates an embodiment of a crystalline silicon based solar cell 11 of the invention. When an n-type crystalline silicon substrate is used as a crystalline silicon substrate 1 of the one-conductivity-type, a light-incident-side i-type silicon based thin film layer 2, a p-type silicon based thin film layer 3, a light-incident-side transparent conductive layer 4, and a collector electrode 5 are deposited over a light-incident-side surface of the n-type crystalline silicon substrate 1 in this order from the silicon substrate 1 side. A back-side i-type silicon based thin film layer 6, an n-type silicon based thin film layer 7, a back-side transparent conductive layer 8, and a metal electrode layer 10 are deposited over a non-light-incident-side surface of the n-type crystalline silicon substrate 1 in this order from the silicon substrate 1 side.

In the meantime, when a p-type crystalline silicon substrate is used as the one-conductivity-type crystalline silicon substrate 1, a light-incident-side i-type silicon based thin film layer 2, an n-type silicon based thin film layer 3, a light-incident-side transparent conductive layer 4, and a collector electrode 5 are deposited over a light-incident-side surface of the p-type crystalline silicon substrate 1 in this order from the silicon substrate 1 side. A back-side i-type silicon based thin film layer 6, a p-type silicon based thin film layer 7, a back-side transparent conductive layer 8, and a metal electrode layer 10 are deposited over a back-side surface of the p-type crystalline silicon substrate 1 in this order from the silicon substrate 1 side.

First, the crystalline silicon substrate 1 is described herein. In the invention, the one-conductivity-type crystalline silicon substrate 1 may be either a substrate having a p-type conductivity type or an n-type conductivity type. When holes and electrons are compared, the electrons, which are smaller in effective mass and scattering cross section, are generally larger in mobility; thus, it is preferred that the crystalline silicon substrate 1 is an n-type monocrystalline silicon semiconductor substrate since the substrate easily gives a solar cell high in conversion efficiency.

Hereinbelow, with primary reference to an embodiment wherein an n-type crystalline silicon substrate is used as the one-conductivity-type crystalline silicon substrate 1, each constituent element of the crystalline silicon based solar cell 11 will be described in more detail with reference to the shape, production method, physical properties, etc., thereof. When the n-type crystalline silicon substrate is used as the crystalline silicon substrate 1, the "one-conductivity-type" recited in the claims corresponds to the "n-type", and "opposite-conductivity-type" corresponds to the "p-type".

The thickness of the crystalline silicon substrate 1 is 200 µm or less, preferably 170 µm or less, more preferably 150 µm or less. When the thickness of the silicon substrate is made small, the amount of silicon used is decreased so that costs can be decreased. Additionally, there is an advantage that the amount of silicon necessary for manufacturing solar cells may be easily obtained even under conditions when silicon substrates are in short supply. A solar cell having the structure of the invention has an advantage that the solar cell becomes higher in open circuit voltage (Voc) as the silicon substrate becomes smaller in thickness, as well as the advantages regarding costs and supplying performance.

On the other hand, the substrate is reduced in mechanical strength and can be easily broken during manufacturing of the solar cell, if the silicon substrate is excessively small in thickness. Additionally, when the silicon substrate is excessively small in thickness, the substrate does not sufficiently absorb external light (solar light), so that the solar cell tends to be decreased in short circuit current density (Jsc). For this reason, the thickness of the crystalline silicon substrate 1 is preferably 50 µm or more, more preferably 70 µm or more. When rough structures are formed on the surfaces of the silicon substrate 1, the thickness of the crystalline silicon substrate is calculated, as represented by H0 in FIG. 1, as the length between a straight line by which tops of the projections in the light-incident-side rough structure are joined with each other, and a straight line by which tops of the projections in the back-side rough structure are joined with each other.

Preferably, a rough structure is formed in at least one main surface (light-incident-side main surface) of the silicon substrate; and more preferably, a rough structure is formed on each of the two main surfaces thereof. When the rough structure is formed on the surface, light incident to the crystalline silicon substrate is scattered so that the optical path length inside the crystalline silicon substrate can be made large. The form of the rough structure is preferably, for example, a pyramidal form. The pyramidal rough structure can easily be formed on the crystalline silicon substrate surface by use of, for example, an anisotropic etching technique.

The anisotropic etching technique is a technique utilizing a property that an etchant (for example, an aqueous solution of potassium hydroxide) is selected, thereby realizing different etching rates for a (100) plane and a (111) plane of a silicon crystalline. When this method is used, it is preferred that the crystalline silicon substrate is cut out so that its main surface is identical to the (100) plane.

When the anisotropic etching technique is used to form a rough structure on a crystalline silicon substrate surface, the size (depth) of the rough structure of the crystalline silicon substrate generally tends to be made larger as the etching is further advanced. In order to advance the etching still further, for example, it is advisable to make the etching period long. It is also advisable to make the etchant concentration or the liquid temperature high, thereby making the reaction rate larger. The etching rate is varied in accordance with the state of the surface when the etching is started; thus, the size of the rough structure may be controlled, for example, by performing a rubbing step or some other step, thereby changing the surface state.

When any one of the silicon based thin film layers, and the other layers, are formed onto the crystalline silicon substrate, defects due to compressive stress may be generated in sharp valleys made in the surface of the crystalline silicon substrate, thereby causing a fall in the characteristics of the solar cell. It is therefore preferable to add the step of moderating the form of the rough structure of the surface of the crystalline silicon substrate. The step of moderating the form of the rough structure can be realized, for example, by setting the step of performing isotropic etching that is low in selectivity for the (100) plane and the (111) plane after the etching step of forming the rough structure in the crystalline silicon substrate surface.

Figure 2:
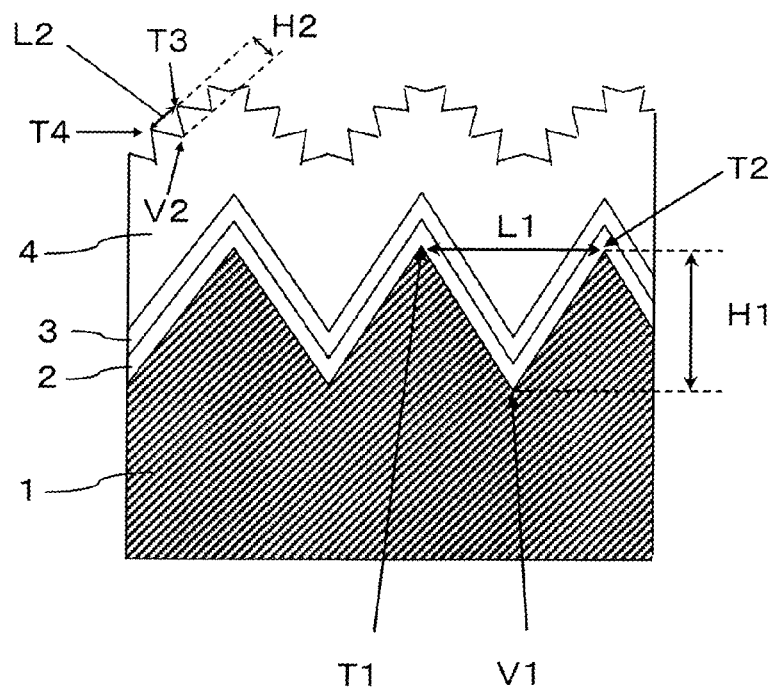
FIG. 2 is a schematic sectional view wherein the light-incident-side of FIG. 1 is enlarged.

It is preferred that the rough structure of the crystalline silicon substrate 1 is continuous as illustrated schematically in FIG. 2 in order to permit the substrate 1 to gain a sufficient light scattering property. This is because the light scattering property tends to decline unless the rough structure is in a continuous form. Herein, the word "continuous" means the state where the structure does not substantially have any flat region, and its projections are adjacent to each other.

The size of the rough structure of the crystalline silicon substrate surface can be characterized by the top-bottom distance between tops of the projections and valleys thereof. As illustrated in FIG. 2, the top-bottom distance, which is represented by H1, is defined by the length between a line by which tops T1 and T2 of individual projection of the rough structure that are adjacent to each other are joined to each other, and a valley V1 of the bottom between the two tops.

The top-bottom distance of the rough structure of the crystalline silicon substrate surface can be specified by, for example, a method of using a scanning electron microscope (SEM) to observe the form of a cross section of the substrate, or of using an atomic force microscope or laser microscope to measure the form of the surface of the substrate. The use of the surface profile makes it possible to specify the top-bottom distance more easily than the use of the cross section profile for the following reason: it is important to specify the tops in the rough structure to determine the top-bottom distance of the rough structure of the crystalline silicon substrate; and the observation of the surface profile makes it possible that the tops in the rough structure are more easily and more precisely identified.

Specifically, the top-bottom distance H1 is obtained by using an atomic force microscope (AFM) to scan an area of about 40 µm×40 µm of the crystalline silicon substrate surface and measuring the form of the surface. From the measured surface profile (AFM image), the top T1 of a projection of the rough structure is selected at random; and the top of a projection of the rough structure that is adjacent to the top T1 is defined as the top T2, and the valley of the bottom between the tops T1 and T2 is defined as the valley V1. It is advisable that the top-bottom distance H1 is calculated based on the distance between the straight line T1-T2 and V1. When the rough structure has dispersion in roughness size, it is advisable to measure the surface form of the crystalline silicon substrate at arbitrary positions, repeat the calculation of the top-bottom distance through the above-mentioned method 20 times to calculate the average of the heights of the rough structure, and define this average as the height H1 of the rough structure.

Regarding the size of the rough structure of the crystalline silicon substrate surface, the top-bottom distance H1 of the rough structure ranges preferably from 0.5 to 40 µm, more preferably from 1 to 20 µm. If the top-bottom distance of the crystalline silicon substrate surface is less than 0.5 µm, the roughness may be insufficiently formed so that flat regions wherein no projections are formed may remain in the crystalline silicon substrate surface. If the top-bottom distance is more than 40 µm, the mechanical strength of the crystalline silicon substrate tends to decline. By contrast, when the top-bottom distance of the rough structure of the crystalline silicon substrate surface is in the range, the optical path length is increased by light scattering on the crystalline silicon substrate surface in the range of wavelengths of 300 to 1200 nm, which can be absorbed by monocrystalline silicon, and further an effect of decreasing interfacial reflection is effectively obtained by effective scattering of light through the rough structure.

The distance L1 of the projections in the crystalline silicon substrate may be obtained as the distance between the tops T1 and T2. When the rough structure has dispersion in apex distance of the projections, it is advisable to measure, in the same manner as performed to calculate out the top-bottom distance of the rough structure, the surface profile of the crystalline silicon substrate at arbitrary positions, repeat the calculation of the apex distances in rough structure through the above-mentioned method 20 times to calculate the average of the apex distances in the rough structure, and define this average as the apex distance in the rough structure.

The i-type silicon based thin film layers 2 and 6, as well as the conductivity type silicon based thin film layers 3 and 7 are formed over both main surfaces of the crystalline silicon substrate 1, respectively. The method for forming these silicon based thin film layers is preferably plasma CVD (chemical vapor deposition). In general, conditions used for forming the silicon based thin film layers are preferably as follows: a substrate temperature of 100 to 300° C.; a pressure of 20 to 2600 Pa; and a high-frequency power density of 0.003 to 0.5 W/cm$^2$. A source gas used to form the silicon based thin film layers may be, for example, a silicon-containing gas such as $SiH_4$ or $Si_2H_6$, or a gas wherein the silicon-containing gas is mixed with $H_2$.

The i-type silicon based thin film layers 2 and 6, which are substantially intrinsic semiconductors, may each be made of, for example, an i-type hydrogenated amorphous silicon (a-Si:H), which is composed of silicon and hydrogen, an i-type hydrogenated amorphous silicon oxide (a-SiO$_x$:H), which is composed of silicon, hydrogen and oxygen, or an i-type hydrogenated amorphous silicon carbide (a-SiC$_x$:H), which is composed of silicon, hydrogen and carbon. The i-type silicon based thin film layers are in particular preferably made of i-type hydrogenated amorphous silicon. When the i-type hydrogenated amorphous silicon layers are formed by CVD, the diffusion of impurities into the crystalline silicon substrate 1 is inhibited so that the surfaces of the substrate can be effectively passivated. When the amount of hydrogen in each of the i-type silicon based thin film layers is changed in the thickness direction, the layer may have an energy gap profile effective for collecting carriers.

The p-type silicon based thin film layer 3 and the n-type silicon based thin film layer 7 are formed over the i-type silicon based thin film layers 2 and 6, respectively. A dopant gas for forming the p-type layer or the n-type layer is preferably, for example, $B_2H_6$ or $PH_3$. The amount of an impurity such as P or B added is sufficient to be a trace amount; thus, it is preferred to use a mixed gas wherein $B_2H_6$ or $PH_3$ is beforehand diluted with $SiH_4$ or $H_2$. When a gas containing a different element, such as $CH_4$, $CO_2$, $NH_3$ or $GeH_4$, is added thereto, silicon is alloyed so that the energy gaps of the conductivity type silicon based thin film layers can be changed.

The p-type silicon based thin film layer 3 may be made of, for example, a p-type hydrogenated amorphous silicon composed of silicon and hydrogen, a p-type hydrogenated amorphous silicon oxide composed of silicon, hydrogen and oxygen, or a p-type hydrogenated amorphous silicon carbide composed of silicon, hydrogen and carbon. The p-type silicon based thin film layer 3 is in particular preferably a p-type hydrogenated amorphous silicon layer or a p-type oxide amorphous silicon layer. In order to inhibit the diffusion of impurities and decrease the series resistance of the solar cell, a p-type hydrogenated amorphous silicon layer is preferably used. In the meantime, in order to cause the layer 3 to function as a low-refractive index layer having a wide gap to decrease an optical loss, a p-type oxide amorphous silicon layer is preferably used.

The n-type silicon based thin film layer 7 may be made of a single n-type amorphous silicon based thin film layer, or plural layers. The n-type silicon based thin film layer 7 is, in particular, desirably made of two layers as illustrated in FIG. 1, i.e., an n-type amorphous silicon based thin film layer 7a and an n-type microcrystalline silicon based thin film layer 7b. When the n-type silicon based thin film layer 7 is an n-type microcrystalline silicon based thin film, the layer 7 has an advantage that a good ohmic contact is produced in the interface between the layer 7 and the back-side transparent conductive layer 8. On the other hand, it is necessary to generate plasma at a high power to generate a high-density hydrogen plasma to form the n-type microcrystalline silicon layer. By contrast, as illustrated in FIG. 1, when the n-type amorphous silicon layer 7a is thinly formed on the i-type hydrogenated amorphous silicon layer 6 and then the n-type microcrystalline silicon based thin film layer 7b is formed on this underlying layer, the power necessary for the deposition can be decreased. Thus, when the n-type silicon based thin film layer 7 is composed of the two layers, the diffusion of impurities into the i-type silicon based thin film layer 6, as well as damage during the deposition, is decreased.

The n-type amorphous silicon based thin film layer 7a is preferably an n-type hydrogenated amorphous silicon layer or an n-type amorphous silicon nitride layer since good junction properties between any adjacent layer can be easily obtained. The n-type microcrystalline silicon based thin film layer 7b is, for example, an n-type microcrystalline silicon layer, an n-type microcrystalline silicon carbide layer, or an n-type microcrystalline silicon oxide layer. In order to inhibit the generation of defects inside the n-type layer, it is preferred to use an n-type microcrystalline silicon layer to which an impurity other than the dopant is not positively added. In the case of using as the n-type microcrystalline silicon based thin film layer 7b, an n-type microcrystalline silicon carbide layer or an n-type microcrystalline silicon oxide layer, an effective optical gap can be widened and the layer 7 is also lowered in refractive index; thus, optical advantages can be obtained. When oxygen or carbon is added to the n-type microcrystalline silicon based thin film layer 7b, it is preferred to add the element at a flow rate ratio which does not hinder the silicon element from being crystallized ($CO_2/SiH_4 < 10$, $CH_4/SiH_4 < 3$).

The thickness of each of the i-type silicon based thin film layers 2 and 6, and the conductivity type silicon based thin film layers 3 and 7 is preferably from 3 to 20 nm. When the thickness is in this range, the thickness of each of the layers is far smaller than the size (in the order of micrometers) of the rough structure of the crystalline silicon substrate 1 so that the surface forms of the p-type silicon based thin film layer 3, and the n-type silicon based thin film layer 7 are substantially equal to that of the crystalline silicon substrate as illustrated schematically in FIGS. 1 and 2.

The light-incident-side transparent conductive layer 4 is formed on the p-type silicon based thin film layer 3, and the back-side transparent conductive layer 8 is formed on the n-type silicon based thin film layer 7. Details of the structure and the forming method of these transparent conductive layers will be described later.

The collector electrode 5 as a light-incident-side electrode is formed on the light-incident-side transparent conductive layer 4. The collector electrode is generally made of an opaque material such as an Ag paste; thus, when the area of the collector electrode is large, there is caused an inconvenience that the light receiving area of the photoelectric converter is reduced so that an output current therefrom declines. It is therefore preferred that the collector electrode 5 is patterned. The method for the patterning may be a method of forming the collector electrode by ink-jetting, screen printing, a conductive wire bonding method, spraying, or some other method. From the viewpoint of productivity, screen printing is preferably adopted. In the screen printing, it is preferred to use the step of using a printing screen to paint a conductive paste composed of metal particles (such as Ag particles), a resin binder, a solvent and others into a desired pattern, and then dry the paste, thereby forming a patterned collector electrode. In order to make the light receiving area large, it is preferred that the area of the collector electrode 5 is small. However, when the area (line width) of the collector electrode is made too small, there is caused an inconvenience that a loss based on the electric resistance of the collector electrode itself becomes large. Thus, it is advisable to decide the shape or the line width of the collector electrode, considering a balance between these two matters.

The metal electrode layer 10 is formed on the back-side transparent conductive layer 8. When a material high in reflectivity, such as Ag or Al, is used for the metal electrode layer 10, transmitted light which is not absorbed in the silicon substrate 1 can be prevented from leaking to the outside of the cell from the back-side. The metal electrode layer 10 may be formed by the same method as used to form the collector electrode 5 except that the layer 10 is formed on a substantially entire surface of the transparent conductive layer 8. Between the back-side transparent conductive layer 8 and the metal electrode layer 10, a reflecting layer may be formed (not illustrated). For the reflecting layer, a metal layer of Ag or Al is preferably used.

Figure 10:
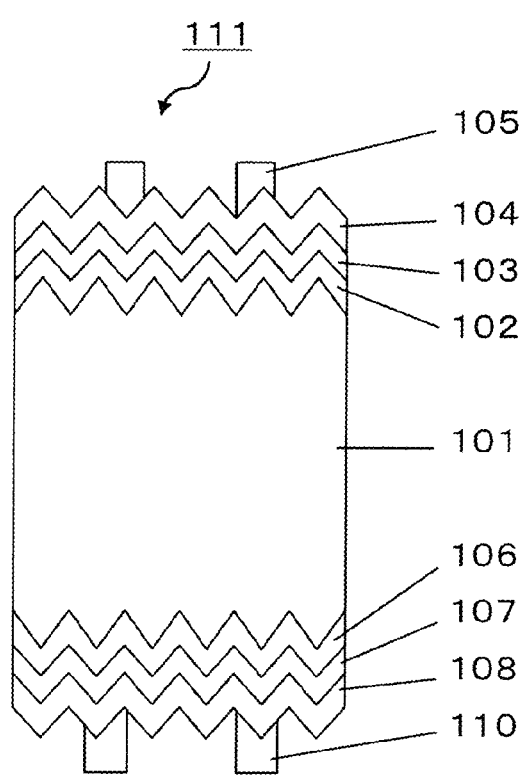
FIG. 10 is a view illustrating a schematic structural section of a crystalline silicon based solar cell according to the prior art.

Conventionally, as illustrated in FIG. 10, the following structure is generally used for a heterojunction solar cell: a structure wherein a silicon substrate 101 having a thickness of about 300 μm is used, and, over both main surfaces thereof, i-type silicon based thin film layers 102 and 106, conductivity type silicon based thin film layers 103 and 107, transparent conductive layers 104 and 108, and collector electrodes 105 and 110 are respectively formed. However, in the case of using, in a structure as illustrated in FIG. 10, a silicon substrate having a thickness of 200 μm or less, light that is not absorbed in the silicon substrate comes to leak, as transmitted light, from the back-side. Thus, with respect to characteristics of the solar cell, the short circuit current (Jsc) thereof tends to lower. From this viewpoint, it is preferred in the invention to lay the reflective metal electrode layer 10 over the back surface of the substrate as described above, thereby reflecting the light not absorbed in the silicon substrate 1 to again enter into the silicon substrate 1.

In the meantime, in the structure having the back-side metal electrode layer 10 formed on substantially the whole of the surface of the cell while the collector electrode 5 at the light-incident-side is patterned, the light-incident-side stack structure of the silicon substrate 1 is different from the back-side stack structure thereof, which may cause a problem that the cell is warped.

Generally, steps for manufacturing a solar cell, such as the formation of its collector electrode and the measurement of the conversion efficiency thereof, are performed in the state where the solar cell is fixed onto a processing stand. At this time, a method of discharging the air through a hole made in the processing stand to adsorb the solar cell onto the processing stand (adsorbing method) is widely used. When the adsorbing method is adopted, the adsorption becomes insufficient if the warp amount of the cell is large. There is then generated a tendency that the solar cell is not fixed on the processing stand so that the efficiency of the production declines. Additionally, the warp of the solar cell, if any, also causes a gap between the processing stand and the solar cell when the cell is adsorbed; and this gap may cause a problem that a foreign substance, which causes the solar cell to be cracked, is absorbed through this gap.

The inventors have used a silicon substrate 1 of about 150 μm thickness, and manufactured a cell wherein an ITO layer is formed, as a light-incident-side transparent conductive layer, into a thickness of about 100 nm thereon by sputtering, and further a collector electrode is formed thereon. As a result, a warp having convexity in the light-incident-side is generated. It is assumed that this cell warp is caused by the fact that the light-incident-side stack structure of the silicon substrate is different from the back-side stack structure thereof. In other words, stress generated in each of the layers constituting the solar cell is varied mainly in accordance with constants of the material, such as the Young modulus thereof, an internal strain of the material, and the thickness of the layer. When the stack structures of the silicon substrate 1 are different between the light-incident-side and the back-side, a difference is generated in stress between the front side and the back-side of the silicon substrate. This difference in stress would cause the warp. When the thickness of the silicon substrate 1 is in particular as small as 200 μm or less, the silicon substrate tends to be easily warped since the substrate is small in flexural rigidity.

It has also been made evident that in a cell wherein an ITO layer of about 100 nm thickness is formed as a light-incident-side transparent conductive layer, a warp is generated and further the Jsc thereof is remarkably lowered. It is assumed that a reason therefor is as follows: the absorbance index of silicon monocrystal is small for light having wavelengths longer than a wavelength of 850 nm (infrared light); thus, when the thickness of a crystalline silicon substrate that is made of silicon monocrystal is as small as 200 μm or less, in particular, 150 μm or less, the silicon substrate cannot completely absorb light rays having the longer wavelengths so that reflected light from the back-side metal electrode layer is emitted from the light-incident-side of the cell.

In the invention, the light-incident-side transparent conductive layer, which is arranged at the light-incident-side, is made to have a specific structure, whereby the cell can be inhibited from being warped. In connection with the matter that the structure of the light-incident-side transparent conductive layer makes it possible to inhibit the cell from being warped, a description is first made about an assumed principle for the cell warpage when the silicon crystalline substrate is thin.

Since the i-type silicon based thin film layers 2 and 6, and the conductivity type silicon based thin film layers 3 and 7 are each sufficiently smaller in thickness than the silicon substrate, it is unnecessary in many cases to consider stresses based on these layers when any warp of the solar cell is investigated. As described above, however, the collector electrode and the back-side metal electrode are each formed by painting a paste material and then drying the paste to be solidified, so as to give a shrinkage stress onto the silicon substrate. These layers are each formed into a thickness of about 10 to 80 μm, which is far larger than the thickness of the silicon based thin film layers; therefore, when the layers are formed on the substrate, the layers easily cause the substrate to be warped into a direction along which the periphery of the cell is raised up. In particular, when the back-side metal electrode layer 10 is formed in substantially the whole area of the rear surface of the cell while the collector electrode 5 at the light-incident-side is patterned, it appears that the shrinkage stress at the back-side of the silicon substrate becomes larger than that at the light-incident-side thereof so that the cell tends to warp so as to make the light-incident-side convex.

In conventional heterojunction solar cells, their light-incident-side and back-side transparent conductive layers are layers each formed by making a metal oxide, such as tin oxide, zinc oxide, indium tin oxide (ITO), or indium-titanium oxide into a film form by CVD, sputtering, vacuum deposition, or some other method. In order to cause the transparent conductive layers to have an anti-reflecting property so that a high short circuit current density is obtained while light absorption into the transparent conductive layers is inhibited, an ITO layer made into a thickness of about 100 nm by sputtering is widely used. In such a structure, a difference in shrinkage stress is not moderated between the front and back-sides of the silicon substrate. Thus, when the silicon substrate used is thin, the cell is easily warped.

By contrast, in the invention, the light-incident-side transparent conductive layer 4, which is a transparent conductive layer at the light-incident-side, is a zinc oxide layer which contains hexagonal zinc oxide having a specific crystal orientation property, and has a surface having an irregular structure. According to this structure, the cell is inhibited from being warped and further the adhesive property between the light-incident-side transparent conductive layer 4 and the collector electrode 5 is improved. Additionally, the photoelectric conversion characteristics of the cell are also improved.

Hereinafter, a detailed description is made about the structure of the light-incident-side transparent conductive layer 4, and the forming method thereof. The light-incident-side transparent conductive layer includes a zinc oxide layer. The zinc oxide layer of the transparent conductive layer 4 contains hexagonal zinc oxide preferentially oriented along the (10-10) plane direction, the (11-20) plane direction, or the (10-11) plane direction. Furthermore, the lattice constant along the a-axis direction (the (11-20) plane direction) of the zinc oxide is set into a specific range, whereby the warp of the cell can be lessened.

Figure 3:
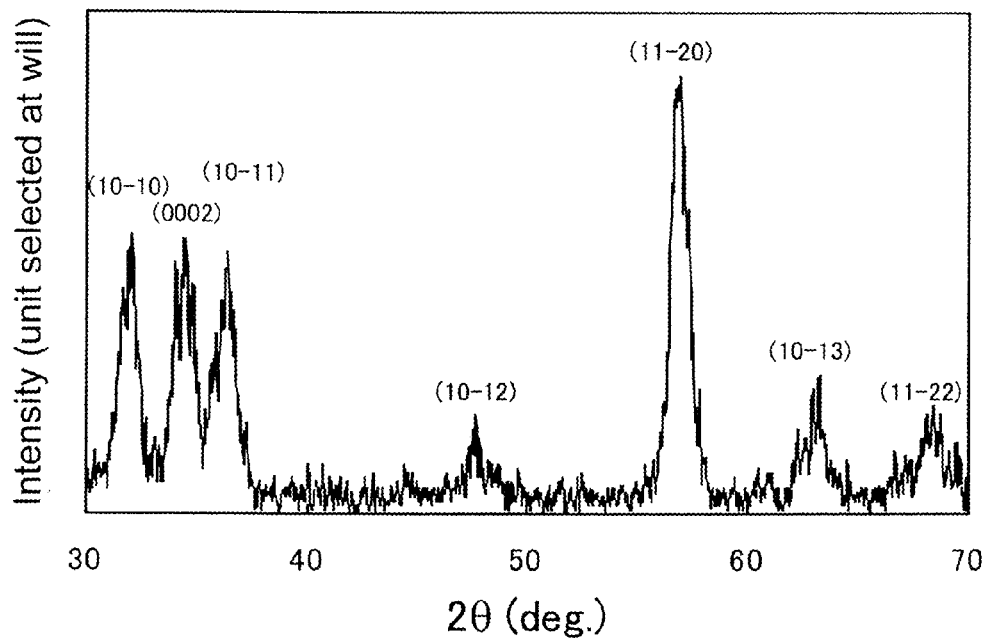
FIG. 3 is a chart showing a result obtained by measuring the XRD of a zinc oxide layer.

With reference to FIG. 3, a description is made about a method for determining the preferred orientation plane of the zinc oxide and the lattice constant thereof along the a-axis. FIG. 3 shows an X-ray diffraction (XRD) pattern of a zinc oxide film formed by CVD and having a hexagonal crystal structure. Peaks near $2\theta=31.5°$, $34.5°$, $36.5°$, and $57.0°$ are diffraction peaks from the (10-10), (0002), (10-11) and (11-20) planes, respectively. In a case where the diffraction strength from the (11-20) plane is higher than those from the other diffraction faces, this case means, in the present specification, that the crystal is preferentially oriented along the (11-20) plane direction. In the same manner, in a case where the diffraction strength from the (10-11) plane is higher than those from the other diffraction faces, and a case where the diffraction strength from the (10-10) plane is higher than those from the other diffraction faces, these cases mean that the crystal is preferentially oriented along the (10-11) plane direction, and that the crystal is preferentially oriented along the (10-10) plane direction, respectively.

When the crystal orientation property of zinc oxide is evaluated, diffraction peaks of Si may overlap with diffraction peaks of the zinc oxide when a zinc oxide layer formed on a silicon substrate having a rough structure is used. It is therefore preferred to make a measurement while the tilt angle of the substrate is adjusted so as not to overlap the diffraction peaks. In a simple method, it is allowable to form zinc oxide on a glass substrate under the same conditions as used to form a zinc oxide film on the silicon substrate, and then measure the X-ray diffraction pattern thereof to evaluate the crystal orientation property.

The diffraction angle $2\theta_a$ of the (11-20) plane is measured, and then the lattice constant $a_{ZnO}$ along the a-axis can be calculated out from the following equation (1):

$$a_{ZnO} = \lambda/\sin(\theta_a) \quad (1)$$

wherein $\lambda$ is the wavelength of the X-ray. When, for example, the Cu K$\alpha$ ray is used for a source of the X-ray, $\lambda$ is 0.154 nm.

Since the lattice constant along the a-axis of zinc oxide monocrystal is 0.3249 nm, it can be mentioned that when the lattice constant along the a-axis is smaller than 0.3249 nm, a shrinkage strain is generated in the zinc oxide layer. The inventors have conceived an idea that when a shrinkage stress is caused to act onto the light-incident-side transparent conductive layer 4 arranged at the light-incident-side of the silicon substrate 1, a shrinkage stress based on the metal electrode layer 10 arranged at the back-side of the silicon substrate 1 is cancelled so that the cell can be inhibited from being warped.

Figure 4:
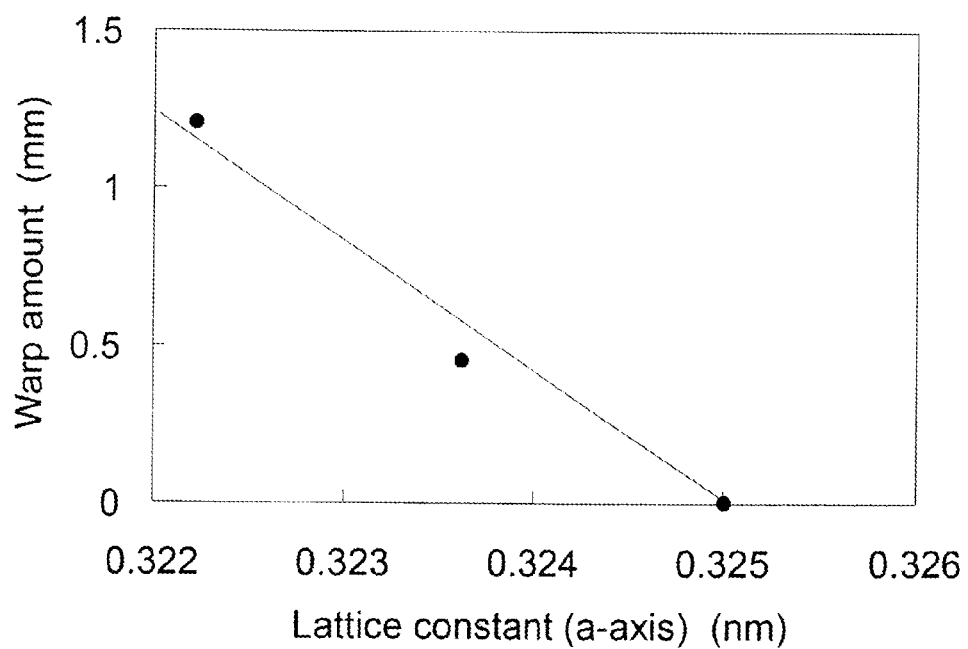
FIG. 4 is a graph showing a relationship between the lattice constant along the a-axis of a zinc oxide layer and the warp amount of the substrate.

In order to verify such an effect of the shrinkage stress by controlling the lattice constant, the inventors have formed a zinc oxide layer of 1300 nm in thickness on a silicon substrate with of 150 μm in thickness and 125 mm in square having rough structures formed in both main surfaces thereof, respectively, by thermal CVD under various deposition conditions, and then evaluated a relationship between the lattice constant along the a-axis and the warp amount of the substrate. The results are shown in FIG. 4. In FIG. 4, when the side of the substrate where the zinc oxide layer is formed is warped into a convex form, the sign of the amount of the warp is defined as plus (+). When the lattice constant along the a-axis is 0.3249 nm, that is, the crystal structure of the zinc oxide layer has no strain, the silicon substrate is not substantially warped. However, the warp amount is steadily increased as the lattice constant along the a-axis is decreased. From this result, it is understood that when the lattice constant along the a-axis of the zinc oxide is set to less than 0.3249 nm to generate a shrinkage stress in the light-incident-side transparent conductive layer and then this shrinkage stress is balanced with a shrinkage stress based on the metal electrode layer 10, the cell can be inhibited from being warped.

It is preferred that the shrinkage stress based on the zinc oxide layer is adjusted to be balanced with the shrinkage stress based on the metal electrode layer. It is difficult to evaluate directly the shrinkage stress based on the metal electrode layer itself; it is advisable, for example, to form the metal electrode layer on the silicon substrate, evaluate the warp amount thereof, and make the warp amount generated when the zinc oxide layer is formed on the silicon substrate substantially equal to the warp amount generated when the metal electrode layer is formed thereon.

The warp amount is varied in accordance with the thickness or size of the silicon substrate. It is however preferred to adjust the lattice constant along the a-axis of the zinc oxide to set the warp amount generated when the zinc oxide layer is formed on the silicon substrate into the range of about 0.1 to 1 mm. If the warp amount when the zinc oxide layer is formed is too small, the shrinkage stress based on the zinc oxide layer is insufficient for cancelling the shrinkage stress based on the metal electrode layer 10 so that the cell tends to be warped to make the light-incident-side into a convex form. On the other hand, if the warp amount when the zinc oxide layer is formed is too large, the warp amount of the solar cell becomes large during a period from the end of the formation of the light-incident-side transparent conductive layer 4 to the formation of the metal electrode layer 10. Thus, there is produced a tendency that the adsorption of the cell is insufficient, the cell is cracked, and other inconveniences are easily caused during this period in the manufacturing process. In order to set the warp amount based on the zinc oxide layer into the above-mentioned range, the lattice constant along the a-axis of the zinc oxide layer is preferably from 0.3225 to 0.3246 nm, more preferably from 0.3230 to 0.3240 nm.

In a case where the thickness of the silicon substrate is from about 50 to 200 μm, the solar cell can be inhibited from being warped when the lattice constant along the a-axis of the zinc oxide is in the range. In order to inhibit the warp more strictly, it is preferred to control the lattice constant along the a-axis, considering the thickness of the zinc oxide layer. Specifically, the thickness of the zinc oxide layer is preferably from 300 to 2500 nm, as will be described late. When the thickness is in such a thickness range, the shrinkage stress based on the zinc oxide layer is substantially in proportion to the strain of the crystal structure, and the thickness $d_{ZnO}$ of the zinc oxide layer. Moreover, the strain of the crystal structure is in proportion to the difference between the lattice constant $a_{ZnO}$ along the a-axis and the lattice constant along the a-axis of zinc oxide monocrystal not strained, i.e., 0.3249 nm. For this reason, the shrinkage stress based on the zinc oxide layer is in proportion to the stress strain parameter S represented by the lattice constant $a_{ZnO}$ (nm) along the a-axis of the zinc oxide layer and the thickness $d_{ZnO}$ (nm) of the zinc oxide layer, i.e., $(a_{ZnO} - 0.3249) \times d_{ZnO}$.

In order to make the warp amount of the solar cell small, the stress strain parameter S is preferably from 0.3 to 2.9 nm², more preferably from 0.5 to 2.6 nm², even more preferably from 1.0 to 2.0 nm². If the stress strain parameter S is smaller than the range, the shrinkage stress based on the zinc oxide layer may be insufficient for cancelling the shrinkage stress based on the metal electrode layer 10. If the stress strain parameter S is larger than the above-mentioned range, the shrinkage stress based on the zinc oxide layer is large so that the warp amount of the solar cell tends to become large until the metal electrode layer 10 is formed. Furthermore, also in the cell wherein the metal electrode layer 10 has been formed, the side of the cell where the zinc oxide layer is formed may be largely warped into a concave form.

In order to set, into the above-mentioned preferred range, the warp amount of the substrate during the period from the end of the formation of the zinc oxide layer to the formation of the metal electrode layer 10, the warp amount parameter W is preferably from $0.3 \times 10^{-5}$ to $2.9 \times 10^{-5}$ nm, more preferably from $0.5 \times 10^{-5}$ to $2.6 \times 10^{-5}$ nm, even more preferably from $1.0 \times 10^{-5}$ to $2.0 \times 10^{-5}$ nm. The warp amount parameter W is a value obtained by dividing the stress strain parameter S by the thickness $d_{Si}$ of the silicon substrate, and is represented by $(a_{ZnO} - 0.3249) \times d_{ZnO}/d_{Si}$.

Furthermore, it is preferred that the zinc oxide layer reflects the profile of the rough structure of the crystalline silicon substrate 1 and further the outermost surface thereof, that is, the surface at the collector electrode 5 side has a fine irregular structure smaller in top-bottom distance than the rough structure of the silicon substrate 1. As will be described later, zinc oxide is a material preferred for forming such a fine irregular structure.

In order to inhibit the cell from being warped, a zinc oxide layer having a controlled crystal structure is used in the invention. In the meantime, in order to inhibit the cell from being warped by the shrinkage stress of the zinc oxide layer, it is necessary to set the thickness of the zinc oxide layer to a large value of, for example, 300 nm or more. As is well understood, when a transparent conductive layer having such a large thickness is formed over a silicon substrate at the light-incident-side thereof, it is feared that the resultant solar cell element is lowered in short circuit current density by a decrease in the amount of light incident into the silicon substrate. In other words, when the transparent conductive layer is made thick, the absorption of light into the transparent conductive layer is increased and further the optical thickness of the transparent conductive layer exceeds such a range that the optical thickness permits this layer to function effectively as an anti-reflecting layer. It is therefore feared that the amount of light incident into the silicon substrate is decreased.

In the invention, on the other hand, the fine irregular structure is formed in the surface of the light-incident-side transparent conductive layer 4, thereby increasing the scattering of incident light. Specifically, on each of the interface between the air and the light-incident-side transparent conductive layer 4, and the interface between the light-incident-side transparent conductive layer 4 and the opposite-conductivity-type (p-type) silicon based thin film layer 3, external light (solar light) is scattered; thus, the angle of incident light into the crystalline silicon substrate becomes larger than in the case of using a transparent conductive layer having no fine irregular structure, so that the optical path length in the solar cell is increased. Furthermore, multiple reflection is generated by the fine irregular structure in the light-incident-side transparent conductive layer 4 surface, so that the solar cell gains an anti-reflecting effect. For this reason, according to the structure of the invention, the solar cell obtained has higher photoelectric conversion characteristics although the absorption of light into the transparent conductive layer appears to give a larger loss than according to a case where an ITO layer having a thickness of about 100 nm is formed as a light-incident-side transparent conductive layer. Furthermore, the formation of the fine irregular structure increases the surface area of the transparent conductive layer to produce an advantageous effect of heightening the adhesive property between the transparent conductive layer 4 and the collector electrode 5.

Similar to the rough structure of the crystalline silicon substrate, the irregular structure of the zinc oxide layer surface, that is, the size of the irregular structure in the light-incident-side surface of the light-incident-side transparent conductive layer 4 can be characterized by the top-bottom distance thereof. As illustrated schematically in FIG. 2, the top-bottom distance H2 can be determined as the distance between a line by which tops T3 and T4 of projections of the irregular structure that are adjacent to each other are joined to each other, and a valley V2 between the tops. The top-bottom distance H2 of the light-incident-side transparent conductive layer may be measured by the same method described above as the method for measuring the top-bottom distance H1 of the rough structure of the crystalline silicon substrate.

The top-bottom distance H2 of the irregular structure of the transparent conductive layer is preferably from 20 to 250 nm, more preferably from 50 to 200 nm. When the thickness of the zinc oxide layer is in the above-mentioned range, the optical path length is increased by light scattering. Further, advantageous effect of decreasing interfacial reflection on the light-incident-side interface of the transparent conductive layer, namely the interface between the zinc oxide layer and the air, is effectively obtained. Thus, the solar cell is improved in photoelectric conversion characteristics. If the top-bottom distance H2 is small, there is generated a tendency that the cell does not gain a sufficient effect of scattering light in the region of wavelengths of 300 to 1200 nm, which can be absorbed by monocrystalline silicon, or a sufficient anti-reflecting effect on the interface of the air. In the meantime, in order to form an irregular structure having a top-bottom distance H2 larger in the range, it is necessary to make the zinc oxide layer thick. If the zinc oxide layer is too thick, a disadvantage caused by the loss based on light absorption into the zinc oxide layer exceeds the advantage of the anti-reflecting effect and light scattering effect based on the fine irregular structure, so that the solar cell tends to be lowered in short circuit current density.

The apex distance L2 of the irregular structure in the light-incident-side surface of the light-incident-side transparent conductive layer 4 is preferably smaller than the apex distance L1 of the rough structure of the crystalline silicon substrate 1. The apex distance L2 of the irregular structure in the transparent conductive layer can be obtained from the distance between the tops T3 and T4. When the irregular structure is distributed in apex distance, it is advisable to measure, in the same manner as performed to calculate out the top-bottom distance of the irregular structure, the surface form of the transparent conductive layer surface at arbitrary positions, repeat the calculation of the apex distance of the irregular structure through the above-mentioned method 20 times to calculate the average of the apex distances of the irregular structure, and define this average as the apex distance L2 of the irregular structure. When the apex distance L2 of the irregular structure is smaller than the apex distance L1, the fine irregular structure is more densely formed in the surface of the light-incident-side transparent conductive layer 4. Thus, the surface area of the transparent conductive layer 4 becomes large to heighten the adhesive strength between the collector electrode and the transparent conductive layer.

The thickness $d_{ZnO}$ of the zinc oxide layer is preferably from 300 to 2500 nm, more preferably from 700 to 2100 nm, even more preferably from 1000 to 1500 nm. When the thickness of the zinc oxide layer is small, the top-bottom distance H2 of the irregular structure tends to become small. When the thickness of the zinc oxide layer is large, the top-bottom distance H2 tends to become large. When the thickness of the zinc oxide layer is set into the range, the top-bottom distance H2 can be adjusted into the preferred range.

The fact that the structure of crystal is controlled and further a fine irregular structure is formed in a surface thereof is a property peculiar to zinc oxide. In other words, besides zinc oxide, another metal oxide such as tin oxide, ITO, indium-titanium oxide, etc., is generally used as a transparent conductive layer; however, when a layer of one of those metal oxides is formed, it does not occur that a fine irregular structure is formed as in the case of using zinc oxide, so that only a rough structure reflecting the profile of a rough structure of the underlying layer is formed. When the thickness of this metal oxide layer is made large, the profile of the roughness of the underlying layer tends to be moderated.

As will be described later in examples, when the zinc oxide layer contains hexagonal zinc oxide preferentially oriented along the (10-10) plane direction, the (11-20) plane direction or the (10-11) plane direction, the open circuit voltage of the solar cell tends to become higher as the silicon substrate is thinner. For this reason, the solar cell of the invention can realize, despite the small thickness of its silicon substrate, photoelectric conversion characteristics equal to or higher than those of any conventional heterojunction solar cell wherein a silicon substrate having a thickness of about 300 μm is used.

The preferred orientation direction of the zinc oxide layer, the lattice constant along the a-axis, and the form of the irregular structure can be controlled by conditions for forming the zinc oxide layer. It is preferred to form the zinc oxide layer having the above-mentioned predetermined characteristic by thermal CVD. The formation of the zinc oxide layer by thermal CVD is attained by supplying an organic zinc as a main agent gas, an oxidizing agent, a doping gas, and a diluting gas in a heated and reduced pressure atmosphere.

The organic zinc may be diethylzinc (DEZ), dimethylzinc, or some other organic zinc. DEZ is preferred since the compound is good in reactivity with the oxidizing agent, and raw materials thereof are easily available. The oxidizing agent may be water, oxygen, carbon dioxide, carbon monoxide, dinitrogen oxide, nitrogen dioxide, sulfur dioxide, dinitrogen pentaoxide, alcohols (R(OH)), ketones (R(CO)R'), ethers (ROR'), aldehydes (R(COH)), amides ((RCO)$_x$(NH$_{3-x}$) wherein x=1, 2 or 3), or sulfoxides (R(SO)R') wherein R and R' are each an alkyl group, and is preferably water since water is good in reactivity with the organic zinc and is easily handled. The diluting agent may be a rare gas (He, Ar, Xe, Kr or Rn), nitrogen, hydrogen or some other diluting agent, and is preferably hydrogen, which is high in thermal conductivity and gives uniform heat to the inside of the substrate. The doping gas may be diborane (B$_2$H$_6$), alkylaluminum, alkylgallium, or some other, and is preferably diborane, which is excellent in its doping effect. It is preferred to supply the doping gas in the state where the gas is diluted with a diluting gas.

These source gasses are caused to react with each other on a surface of a heated substrate under a reduced pressure of, for example, 5 to 100 Pa, preferably 5 to 40 Pa, and further the resultant is caused to adhere onto the substrate surface, thereby forming the zinc oxide layer, which has the predetermined crystal structure and has the surface having the fine irregular structure. Herein, the substrate denotes the silicon substrate over which the silicon based thin film layers are formed. When the zinc oxide layer is formed, the substrate temperature (deposition temperature) may not be constant. The film needs only to be formed under a condition that the deposition temperature includes a range of 120° C. or higher and 240° C. or lower.

If the film is formed at a temperature lower than a substrate temperature of 120° C., zinc oxide preferentially oriented along a (0002) plane direction is easily formed, and further the top-bottom distance H1 of the rough structure tends to be small. Thus, if the substrate temperature is too low, the light scattering property based on the transparent conductive layer 4 and the adhesion force between the transparent conductive layer and the collector electrode may become insufficient. If the deposition temperature is too low, the deposition rate also falls remarkably so that economical efficiency is poor. On the other hand, if the zinc oxide film is formed at a temperature higher than 240° C., the i-type silicon based thin film layers, and the conductivity type silicon based thin film layers formed over the silicon substrate are also exposed to the high temperature over a long time so that these silicon based thin film layers are deteriorated. Thus, characteristics of the solar cell may become lower. Therefore, the deposition temperature for the zinc oxide layer is preferably 240° C. or lower. When the substrate temperature is set in the range of 130° C. or higher and 180° C. or lower, a zinc oxide layer can be formed which is excellent in transparency and light scattering property, and is low in resistance. Thus, it is more preferred that the deposition temperature for the zinc oxide layer is included in a range of 130 to 180° C.

The preferred orientation direction of the zinc oxide layer is varied mainly in accordance with the substrate temperature during the deposition. When the substrate temperature is from about 120° C. or higher and 210° C. or lower, hexagonal zinc oxide preferentially oriented along the (10-10) plane direction is obtained at the initial stage of the deposition. As the deposition is advanced, hexagonal zinc oxide preferentially oriented along the (11-20) plane direction tends to be obtained. In this temperature range, therefore, a zinc oxide layer preferentially oriented along the (10-10) plane direction tends to be obtained when the thickness of the zinc oxide layer is small; and as the thickness of the zinc oxide layer becomes larger, a zinc oxide layer preferentially oriented along the (11-20) plane direction is further obtained. In a substrate temperature of about 210 or higher and 240° C. or lower, hexagonal zinc oxide preferentially oriented along the (10-11) plane direction is easily obtained.

The lattice constant $a_{ZnO}$ along the a-axis of the zinc oxide layer can also be controlled by the substrate temperature during the deposition. When the substrate temperature is high, the constant $a_{ZnO}$ tends to be small. When the substrate temperature is low, the constant $a_{ZnO}$ tends to be large. Thus, in order to make the stress strain parameter S large, the substrate temperature needs only to be raised. In order to make the stress strain parameter S small, the substrate temperature needs only to be lowered.

The lattice constant $a_{ZnO}$ along the a-axis of the zinc oxide layer may be adjusted by forming the zinc oxide layer and then subjecting the layer to anneal by heating. The temperature for the annealing may be appropriately set. Conveniently, the annealing is conducted at a temperature higher than the deposition temperature by 30° C. to 100° C., whereby an advantageous effect of the annealing is easily obtained. When the zinc oxide layer is formed at a substrate temperature of, for example, 120° C., it is preferred to conduct the annealing at a temperature of 150° C. or higher. As the annealing temperature is higher, the lattice constant $a_{ZnO}$ along the a-axis and the stress strain parameter S tend to be larger and smaller, respectively. When the annealing is conducted in the air atmosphere, a fall in the carrier density is easily caused. Thus, the treatment is conducted preferably under a reduced pressure of 100 Pa or less, more preferably under a vacuum of 10 Pa or less. If the annealing temperature is too high, the carrier density in the zinc oxide is lowered and further the i-type silicon based thin film layers or the conductivity type silicon based thin film layers may be deteriorated. Thus, it is preferable to conduct the annealing at 240° C. or lower.

The top-bottom distance H2 and the apex distance L2 of the irregular structure in the zinc oxide layer surface can be controlled by the substrate temperature in the deposition, or the thickness of the zinc oxide layer. When the substrate temperature is made high, both the top-bottom distance H2 and the apex distance L2 tend to become large. When the substrate temperature is made low, both H2 and L2 tend to become small large. In the meantime, when the thickness $d_{ZnO}$ of the zinc oxide layer is made large, the crystal growth of the zinc oxide advances so that the H2 tends to become large.

Since the proportion of any doped impurity (for example, boron) taken into the film is varied in accordance with the substrate temperature, the amount of any dopant gas (for example, $B_2H_6$ gas) introduced in the formation of the zinc oxide layer is decided in accordance with conditions for forming the film. It is preferred to adjust the amount of the dopant gas introduced to set the carrier density into the range of $3\times10^{19}$ to $2.5\times10^{20}$ cm$^{-3}$. If the carrier density is less than $3\times10^{19}$ cm$^{-3}$, the resistance of the zinc oxide layer may be too high. If the density is more than $2.5\times10^{20}$ cm$^{-3}$, the solar cell may be lowered in short circuit current density due to a fall in transmittance of infrared rays. The carrier density may be obtained by Hall measurement.

When the zinc oxide layer is formed by thermal CVD, it is preferred that the introduction of the dopant gas is stopped or decreased at the initial stage of the formation of the zinc oxide layer to inhibit the dopant from diffusing into the underlying layer thereof, which is the conductivity type silicon based thin film layer 3. In other words, it is desired to form the zinc oxide layer to make the doped impurity concentration in the crystalline silicon substrate side of the zinc oxide layer lower than that in the side thereof opposite to the crystalline silicon substrate. Herein, the crystalline silicon substrate side of the zinc oxide layer, and the side thereof opposite to the crystalline silicon substrate denotes the following regions generated when a cross section of the zinc oxide layer is divided into three regions, each of which is ⅓ of the section in area, in the thickness direction: the region nearest to the conductivity type silicon based thin film layer 3, and the region nearest to the collector electrode 5, respectively.

The doped impurity concentration in the conductivity type silicon based thin film layer side of the zinc oxide layer, and that in the side thereof opposite to the silicon substrate may not be uniform in the respective regions (the regions which are each ⅓ of the whole in thickness). For example, it is allowable to set the impurity amount added in the interface between the zinc oxide layer and the conductivity type silicon based thin film layer to zero, and increase the amount of the dopant gas introduced with the passage of the deposition time, thereby causing the zinc oxide layer to have a profile permitting the impurity concentration to be gradually changed. It is also allowable to cause the zinc oxide layer to have a profile such that the zinc oxide layer region opposite to the crystalline silicon substrate has therein a maximum point of the impurity concentration.

The light-incident-side transparent conductive layer 4 may be made of a single zinc oxide layer as described above, or plural layers. When the light-incident-side transparent conductive layer 4 is made of the plural layers, a metal oxide layer excellent in transparency and conductivity is preferably used between the zinc oxide layer and the conductivity type silicon based thin film layer 3, or on the light-incident-side surface of the zinc oxide layer. The metal oxide may be, for example, a metal oxide material such as tin oxide, indium tin oxide (ITO), or indium-titanium oxide, or a zinc oxide containing a dopant such as In or Si, which is easily made into a dense structure. The light-incident-side transparent conductive layer 4 is preferably made of a single zinc oxide layer in order to provide a solar cell wherein a high adhesion force is attained between the transparent conductive layer 4 and the collector electrode 5 while a good interfacial state is attained between the conductivity type silicon based thin film layer 3 and the transparent conductive layer 4 to improve the photoelectric conversion characteristics.

Similar to the light-incident-side transparent conductive layer 4, the back-side transparent conductive layer 8 may be a zinc oxide layer having a surface having an irregular structure. However, when a reflecting layer or the metal electrode layer 10 is formed over the back surface of the back-side transparent conductive layer 8, it is unnecessary to form, in the back-side transparent conductive film 8, a fine surface irregular structure as formed in the light-incident-side transparent conductive layer 4. In this case, the back-side transparent conductive layer 8 may be a film obtained by forming a metal oxide, such as tin oxide, zinc oxide, indium tin oxide (ITO), or indium-titanium oxide, into a film form by CVD, sputtering, vacuum deposition or some other method. The thickness of the back-side transparent conductive layer 8 is preferably from 60 to 120 nm, more preferably from 80 to 110 nm. The back-side transparent conductive layer 8 may be made of a single layer or plural layers.

When the material constituting the transparent conductive layer 4 or 8 adheres onto a side surface of the crystalline silicon substrate 1, an electrical short circuit may be caused between the transparent conductive layer 4 and the individual layers formed over the opposite surface side of the crystalline silicon substrate 1 to deteriorate characteristics of the solar cell. In order to prevent the short circuit, it is preferred to add, before or after the formation of the transparent conductive layer 4 or 8, a step for preventing the material of the transparent conductive layer from adhering onto any side surface of the crystalline silicon substrate 1. This step is, for example, a step of covering the side surface of the silicon substrate before the formation of the transparent conductive layer, or a step of forming a material for preventing the adhesion of transparent conductive material onto the side surface of the silicon substrate before the formation of the transparent conductive layer. After the formation of the transparent conductive layer, the step may be added of removing the material of the transparent conductive layer adhering to the silicon substrate side surface. The material of the transparent conductive layer adhering to the silicon substrate side surface may be removed in a chemical manner such as etching, or in a physical manner such as polishing.

As described above, the collector electrode 5 is formed on the light-incident-side transparent conductive layer 4, and the metal electrode layer 10 is formed on the back-side transparent conductive layer 8.

The cell may be annealed in order also to solidify the conductive paste used in the collector electrode 5 or the metal electrode layer 10. The annealing by heating may produce advantageous effects, such as an improvement in the transmittances or resistivities of the transparent conductive layers, and an improvement in properties of the individual interfaces, such as a decrease in the contact resistances or the interfacial energy levels thereof. The annealing temperature is preferably, for example, about 150° C. If the annealing temperature is too high, the solar cell characteristics may be deteriorated by the diffusion of the dopant from each of the conductivity type silicon based thin film layers into the intrinsic silicon based thin film layer, the formation of an impurity energy level by the diffusion of a different element from each of the transparent conductive layers to the silicon based thin film layer, the formation of a defect energy level in each of the amorphous silicon based thin film layers, and other causes.

The cell annealing step may function also as the annealing of the zinc oxide layer as the light-incident-side transparent conductive layer 4. Specifically, the cell and the zinc oxide layer can be simultaneously annealed by heating the cell at a temperature which permits the zinc oxide layer to be annealed and does not easily cause inconveniences as described above.

Figure 5:
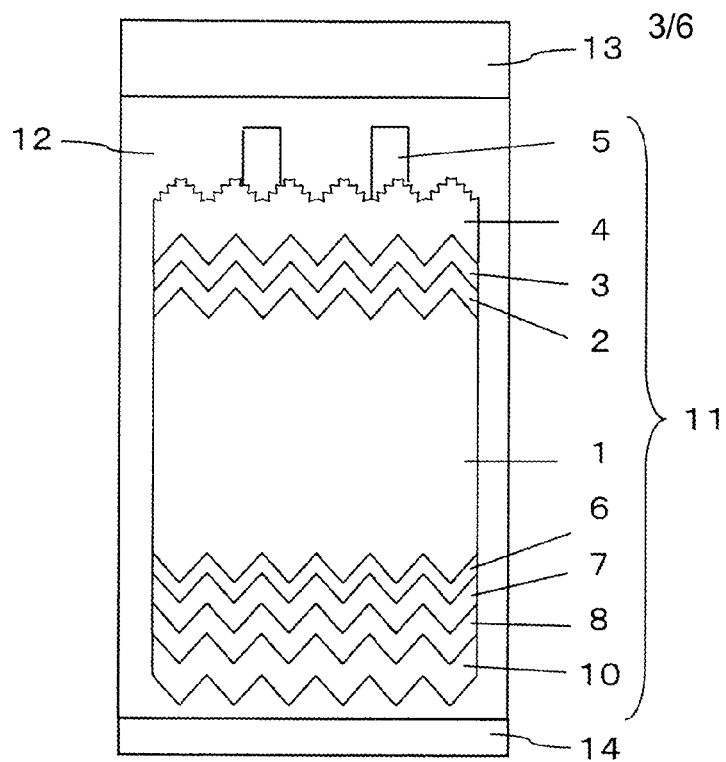
FIG. 5 is a view illustrating a schematic structural section of a crystalline silicon based solar cell according to an embodiment of the invention and made into a module.

As illustrated in FIG. 5, the thus-formed crystalline silicon based solar cell 11 (solar cell) is preferably made into a module by sealing the cell between two substrates 13 and 14 with a filler 12 interposed between the substrates and the cell. The substrates 13 and 14 may each be a glass plate, a plastic film, or some other substrate. In an embodiment, for example, the filler is an EVA resin 12, and a PET film 14 as a protecting film is laminated over a glass plate 13 to seal the solar cell. The solar cell 11 is connected to an external circuit (load) through the light-incident-side collector electrode 5 and the metal electrode layer 10, which is not illustrated in FIG. 5.

The foregoing description primarily relates to a crystalline silicon based solar cell wherein an n-type crystalline silicon substrate is used as the crystalline silicon substrate 1. However, in the case of using a p-type crystalline silicon substrate, a solar cell can be formed, in the same way as in the case of using the n-type crystalline silicon substrate, by forming an n-type silicon based thin film layer instead of the p-type silicon based thin film layer 3 and forming a p-type silicon based thin film layer instead of the n-type silicon based thin film layer 7.

EXAMPLES

Hereinafter, the invention will be more specifically described by way of examples; however, the invention is not limited to the examples described herein.

Example 1

A crystalline silicon based solar cell illustrated in the schematic sectional view of FIG. 1, which is according to the invention, was manufactured as Example 1. The crystalline silicon based solar cell of the present example was a heterojunction solar cell, and an n-type crystalline silicon substrate 1 had rough structures on both surfaces thereof, respectively. Over the light incident surface of the n-type crystalline silicon substrate 1, an i-type amorphous silicon layer 2, a p-type amorphous silicon layer 3, and a zinc oxide layer 4 were formed. A collector electrode 5 was formed on the zinc oxide layer 4. At the back-side of the n-type crystalline silicon substrate 1, an i-type amorphous silicon layer 6, an n-type amorphous silicon layer 7a, an n-type microcrystalline silicon layer 7b, and an indium oxide (ITO) layer 8 were formed. On the ITO layer 8, an Ag metal electrode layer 10 was formed. The crystalline silicon based solar cell of Example 1 was manufactured as follows.

An n-type crystalline silicon substrate having a light incident surface direction identical to the (100) plane direction and having a thickness of 100 μm was immersed in an aqueous HF solution with a concentration of 2% by weight for 3 minutes, to remove a silicon oxide film on any surface of the substrate. The substrate was rinsed two times with ultrapure water. Next, the silicon substrate was immersed in an aqueous KOH/isopropyl alcohol solution, the concentrations thereof having 5% by weight and 15% by weight, respectively, and the temperature thereof being kept at 70° C., for 15 minutes, thereby etching any surface of the n-type crystalline silicon substrate to form rough structures. Thereafter, the substrate was rinsed two times with ultrapure water, and then dried with hot wind.

Figure 6A:
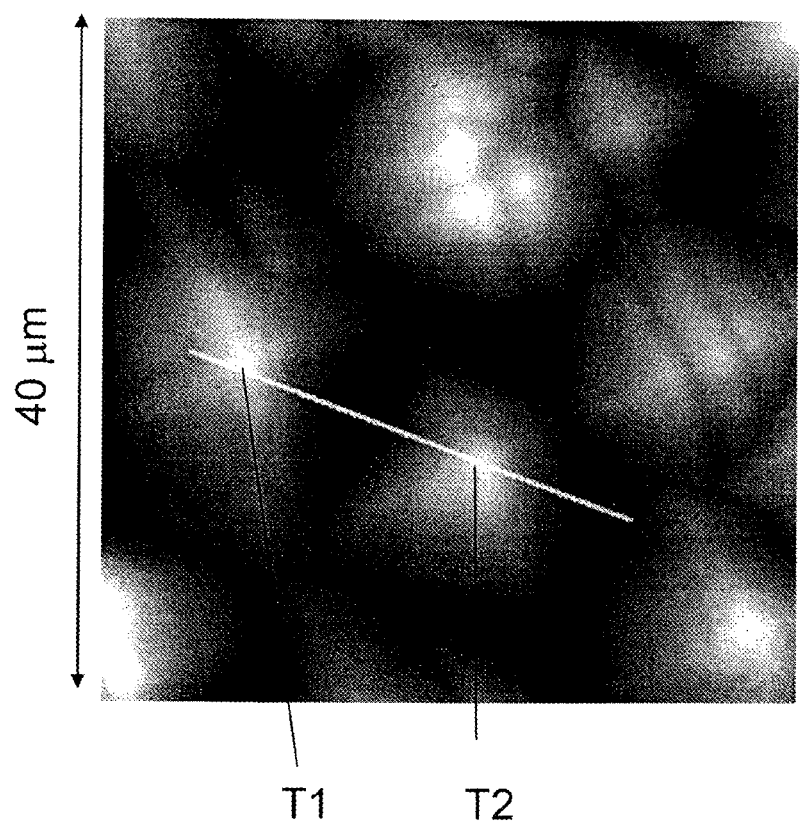
FIG. 6A is an AFM image showing a result obtained by measuring a rough structure of a crystalline silicon substrate surface.
Figure 6B:
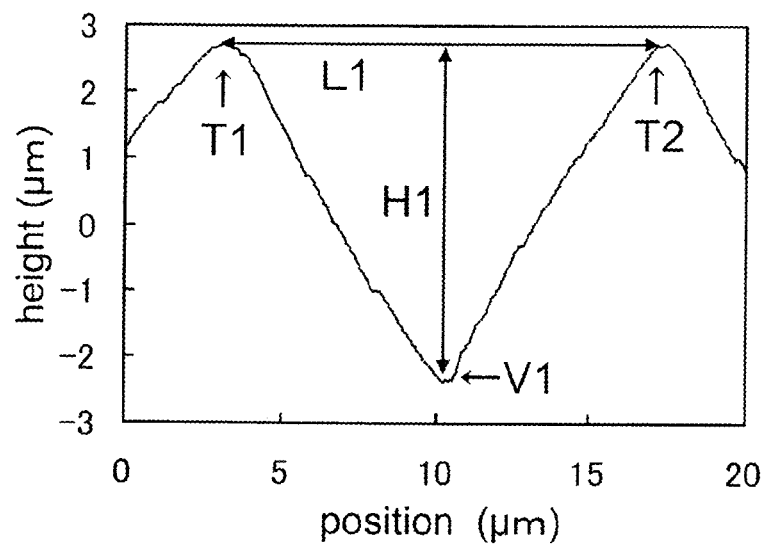
FIG. 6B is a view illustrating an irregularity profile of a cross section containing a straight line T1-T2 in FIG. 6A.

In order to measure the profile of height difference surfaces of the rough structures of this silicon substrate, an atomic force microscope was used to make a surface observation of the crystalline silicon substrate over an area thereof having a size of 40×40 μm². An atomic force microscopic image of one of the surfaces of the silicon substrate is shown in FIG. 6A. As understood from FIG. 6A, in the silicon substrate surface, pyramidal roughness were continuously formed. From FIG. 6A, tops T1 and T2, and a valley V1 were selected. Based on a cross section (FIG. 6B) taken on a straight line (white line in FIG. 6A) passing on the tops T1 and T2, the top-bottom distance H1 of the rough structure of the crystalline silicon substrate was calculated. As a result, the difference H1 was 5 μm. The apex distance L1 of the rough structure of the crystalline silicon substrate was 12 μm.

The n-type crystalline silicon substrate, the etching of which had been finished, was introduced into a CVD apparatus, and an i-type amorphous silicon layer 2 having a thickness of 3 nm was deposited on one of the main surfaces (at the light-incident-side) of the silicon substrate. The thickness of the formed silicon thin film was a value obtained by forming a silicon thin film onto a glass substrate under the same conditions, calculating out the deposition rate from the thickness thereof measured by spectroscopic ellipsometry, and calculating a product of the calculated deposition rate and the deposition period on the supposition that the film on the silicon substrate and that on the glass substrate were formed at the same deposition rate. Conditions for forming the i-type amorphous silicon layer were as follows: the substrate temperature was 170° C.; the pressure was 120 Pa; the flow rate ratio of $SiH_4/H_2$ was 3/10; and the density of the introduced power was 0.011 W/cm$^{-2}$.

A p-type amorphous silicon layer having a thickness of 4 nm was formed onto the i-type amorphous silicon layer. Conditions for forming the p-type amorphous silicon layer were as follows: the substrate temperature was 170° C.; the pressure was 60 Pa; the flow rate ratio of $SiH_4/B_2H_6$ was 1/3; and the density of the introduced power was 0.01 W/cm$^{-2}$. The flow rate of $B_2H_6$ in the present example represents the flow rate of a gas obtained by diluting $B_2H_6$ with $H_2$ to set the concentration of $B_2H_6$ into 5000 ppm. In each of these examples and the comparative examples described below, the same applies to the flow rate of $B_2H_6$.

Next, an i-type amorphous silicon layer 6 having a thickness of 6 nm was formed onto the opposite-side main surface (at the back-side) of the silicon substrate. Conditions for forming the i-type amorphous silicon layer were as follows: the substrate temperature was 170° C.; the pressure was 120 Pa; the flow rate ratio of $SiH_4/H_2$ was 3/10; and the density of the introduced power was 0.011 W/cm$^{-2}$. An n-type amorphous silicon layer 7a having a thickness of 4 nm was formed onto the i-type amorphous silicon layer 6. Conditions for forming the n-type amorphous silicon layer were as follows: the substrate temperature was 170° C.; the pressure was 60 Pa; the flow rate ratio of $SiH_4/PH_3$ was 1/2; and the density of the introduced power was 0.01 W/cm$^{-2}$. An n-type microcrystalline silicon layer 7b having a thickness of 6 nm was formed onto the n-type amorphous silicon layer 7a. Conditions for forming the n-type amorphous silicon layer were as follows: the substrate temperature was 170° C.; the pressure was 800 Pa; the flow rate ratio of $SiH_4/PH_3/H_2$ was 1/5/180; and the density of the introduced power was 0.08 W/cm$^{-2}$. The flow rate of $PH_3$ in the present example represents the flow rate of a gas obtained by diluting $PH_3$ with $H_2$ to set the concentration of $PH_3$ into 5000 ppm. In each of these examples and the comparative examples described below, the same applies to the flow rate of $PH_3$.

The crystalline silicon substrate on which above-mentioned layers were formed was introduced into a thermal CVD apparatus to form a zinc oxide layer as a transparent conductive layer 4 onto the p-type amorphous silicon layer 3 by thermal CVD. In this step, the substrate was first introduced into deposition chamber, and was heated to a temperature of 150° C. Thereafter, source gases were introduced thereinto, and the zinc oxide layer was formed. About the source gases, diethylzinc, water, $H_2$, and $B_2H_6$ gas were introduced to set the ratio between the respective flow rates thereof to a ratio of 1/2/20/10. The $B_2H_6$ gas was a gas obtained by diluting $B_2H_6$ with $H_2$ to set the concentration of $B_2H_6$ into 5000 ppm. The deposition pressure was adjusted to 10 Pa by using a pressure-adjusting valve. The deposition period was set to 22 minutes. The thickness of the zinc oxide layer, which was obtained as a product of the deposition rate and the deposition period, was 1300 nm. The deposition rate of the zinc oxide layer was a value obtained by forming a zinc oxide layer onto a flat silicon substrate for a predetermined period to prepare a sample beforehand, using an SEM to observe a sectional form of this sample to measure the thickness thereof, and then calculating out the thickness/deposition period.

Figure 7A:
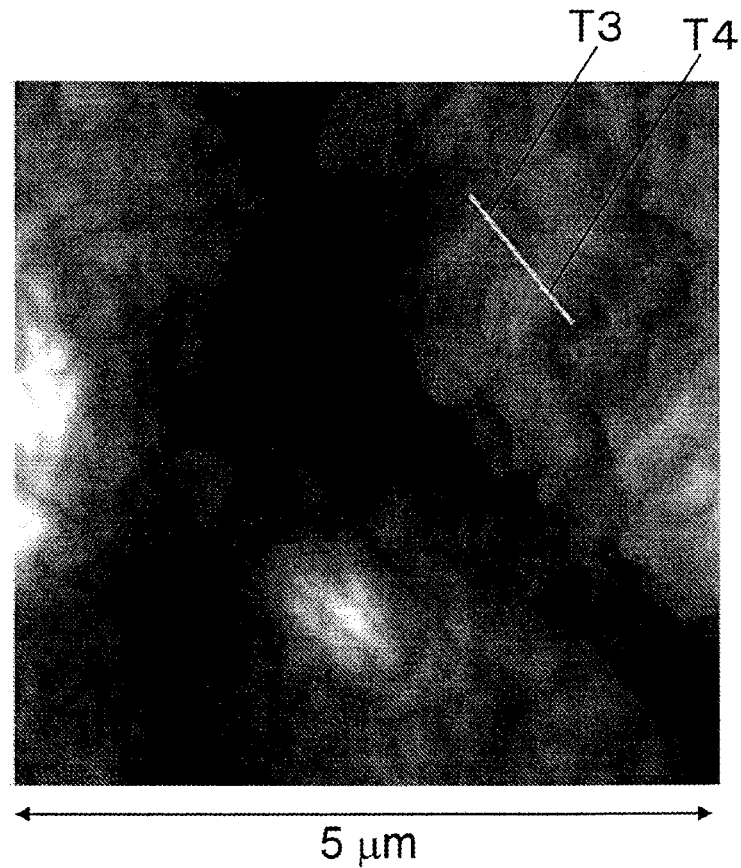
FIG. 7A is an AFM image showing a result obtained by measuring an irregular structure of a transparent conductive layer surface.
Figure 7B:
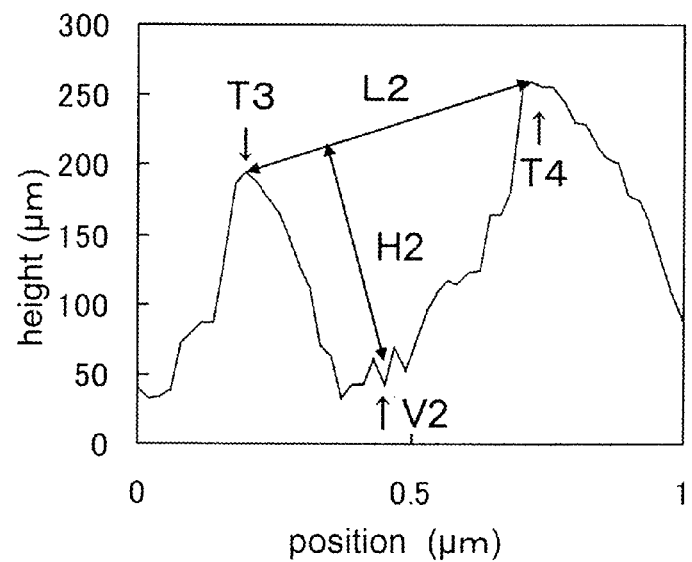
FIG. 7B is a view illustrating an irregularity profile of a cross section containing a straight line T3-T4 in FIG. 7A.

An atomic force microscope was used to observe the form of a surface of this transparent conductive layer 4 over an area thereof having a size of 5×5 µm². An atomic force microscopic image of the surface of the light-incident-side transparent conductive layer is shown in FIG. 7A. As understood from FIG. 7A, in the transparent conductive layer surface, fine irregularities were continuously formed. From FIG. 7A, tops T3 and T4, and a valley V2 were selected. Based on a cross section (FIG. 7B) taken on a straight line (white line in FIG. 7A) passing on the tops T3 and T4, the top-bottom distance of the irregular structure of the transparent conductive layer surface was calculated. As a result, the difference was 180 µm. The apex distance L2 of the irregular structure of the transparent conductive layer 4 was 0.6 µm, which was smaller than the apex distance L1 of the rough structure of the crystalline silicon substrate.

Figure 8:
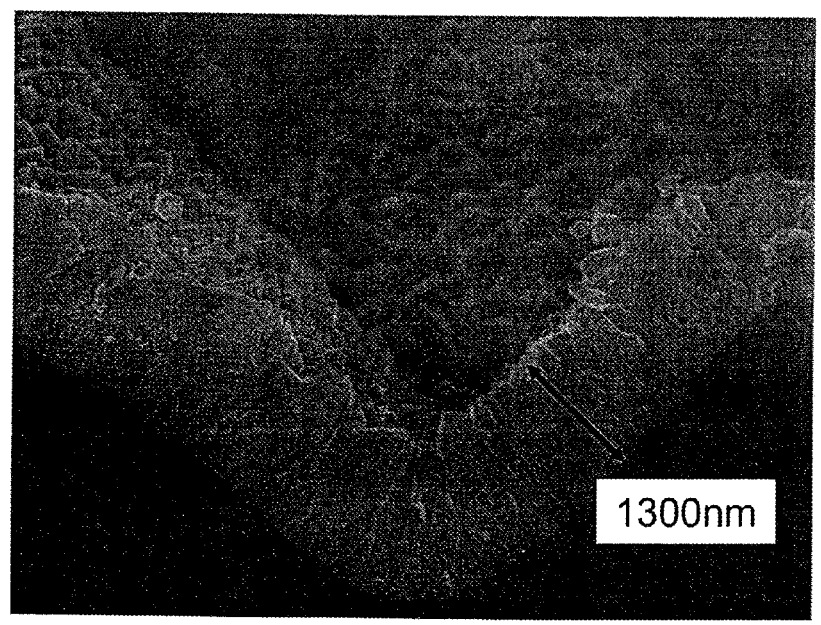
FIG. 8 is an SEM image of a cross section of a transparent conductive layer.

The result obtained by observing a cross section of the silicon substrate over which the transparent conductive layer was formed through a scanning electron microscope is shown in FIG. 8. From the sectional view, the thickness of the transparent conductive layer 4 was measured. As a result, the thickness was 1300 nm, which was consistent with the thickness calculated out as the product of the deposition rate and period.

The crystalline silicon substrate over which the zinc oxide layer 4 was formed was introduced into a sputtering apparatus to form an ITO film having a thickness of 250 nm as a back-side transparent conductive layer 8 onto the n-type microcrystalline silicon layer 7b at the back-side. An ITO sputtering target used therein was a sintered body of indium oxide and tin oxide (content of tin oxide: 5% by weight). The surface profile of the ITO layer reflected the profile of one of the surfaces of the silicon substrate, and the surface did not have a fine irregular structure as seen in the case of the zinc oxide layer.

The silicon substrate having, over each of the surfaces thereof, the layers up to the transparent electrode was allowed to stand still on a horizontal float glass in the state where the light-incident-side of the substrate was faced upward. A thickness gauge was inserted between each of four corners of the substrate and the float glass, and then the interval between each of the outer peripheral regions of the substrate and the float glass was measured. Similarly, in the state where the back-side of the substrate was faced upward, the substrate was allowed to stand still on a float glass, and the interval between each of the outer peripheral regions of the substrate and the float glass was measured. Of these eight measured results, a value largest in absolute value was defined as the warp amount. The used thickness gauge was a gauge having a thickness of from 0.1 to 2 mm (at intervals of 0.1 mm). The sign of the warp amount was defined as plus in a case where the outer peripheral region had a gap (the cell was warped to make the back-side thereof convex) when the cell was set to face the light-incident-side thereof upward. Conversely, the sign of the warp amount was defined as minus in a case where the outer peripheral region had a gap (the cell was warped to make the light-incident-side thereof convex) when the cell was set to face the back-side thereof upward.

Thereafter, a silver paste (FA-333, manufactured by Fujikura Kasei Co., Ltd.) was formed into a collector electrode having a comb-like pattern on the transparent conductive layer 4 by screen printing. At this time, the paste was dried, using a hot wind oven. The temperature and the period therefor were set to 120° C. and 10 minutes, respectively. The thickness of the dried silver paste was 30 µm. Thereafter, the silver paste was painted onto the whole area of the surface of the ITO layer 8 without patterning, and then dried in the same way to form a back-side metal electrode layer 10 having thickness of 15 µm. A glass substrate 13 and a PET film substrate 14 as a protecting film were laminated onto the thus-manufactured solar cell 11 with an EVA resin as a filler 12 interposed therebetween.

With respect to the photoelectric conversion characteristics of the thus-yielded solar cell module, a solar simulator having a spectral distribution of AM 1.5 was used to radiate pseudo solar light thereon at an energy density of 100 mW/cm² and 25° C. In this way, output characteristics thereof were measured to gain the open circuit voltage (Voc), the short circuit current density (Jsc), the fill factor (FF), and the conversion efficiency (Eff).

With respect to another sample that was not sealed, in order to evaluate the adhesion force between its transparent conductive layer 4 and its collector electrode 5, the same silver paste as described above was formed onto an area of 30 mm in square of the light-incident-side transparent conductive layer 4 by screen printing, and then dried to form a layer of 30 µm in thickness. In this way, a sample for test of adhesive strength was obtained. The adhesion force of the collector electrode was evaluated according to a tape peeling test. In the tape peeling test, a cutter knife was used to cut the silver paste layer into the form of grids each having a width of 2 mm, and a testing tape (550P, manufactured by Sumitomo 3M Ltd.) was caused to adhere thereon. The tape was then peeled out at a burst into the perpendicular direction. The adhesion force was evaluated into the following 5 levels by measuring the percentage of the adhesion of the collector electrode onto the adhesive surface of the peeled tape:

1: the adhesion percentage was 80% or more,
2: the adhesion percentage was 60% or more, and less than 80%,
3: the adhesion percentage was 40% or more, and less than 60%,
4: the adhesion percentage was 20% or more, and less than 40%, and
5: the adhesion percentage was less than 20%.

Under the same conditions as described above, an i-type amorphous silicon layer 2 was formed over a silicon substrate having irregularities, and then a p-type amorphous silicon layer 3 and a transparent conductive layer 4 were formed in order to evaluate the crystal structure of the transparent conductive layer 4. An X-ray diffraction apparatus was used to measure the X-ray diffraction pattern of the transparent conductive layer in a 2θ/θ mode. In the measurement, the tilt angle was set to 35° in order to inhibit any diffraction peak based on Si from being appeared.

The measured results are shown in FIG. 3. The transparent conductive layer 4 proved to be made of hexagonal zinc oxide preferentially oriented along the (11-20) plane direction. The carrier density in this transparent conductive measured by Hall measurement was $8 \times 10^{19}$ cm$^{-3}$.

Example 2

In Example 2, a solar cell was manufactured and evaluated in the same way as in Example 1 with the exception that the period for forming the light-incident-side transparent conductive film was changed to 27 minutes.

Example 3

In Example 3, a solar cell was manufactured and evaluated in the same way as in Example 1 with the exception that the period for forming the light-incident-side transparent conductive film was changed to 18 minutes.

Example 4

In Example 4, a solar cell was manufactured and evaluated in the same way as in Example 1 with the exception that the period for forming the light-incident-side transparent conductive film was changed to 11 minutes.

Example 5

In Example 5, a solar cell was manufactured and evaluated in the same way as in Example 1 with the exception that after the formation of the zinc oxide layer, the workpiece was subjected to vacuum annealing at 180° C. for 20 minutes. The vacuum annealing was conducted in an infrared image furnace connected to a vacuum pump. In the annealing step, the vacuum degree was set to the order of $10^{-2}$ Pa.

Example 6

In Example 6, a solar cell was manufactured and evaluated in the same way as in Example 5 with the exception that the temperature and the period for the vacuum annealing after the formation of the zinc oxide layer were set to 200° C. and 10 minutes, respectively.

Example 7

In Example 7, a solar cell was manufactured and evaluated in the same way as in Example 5 with the exception that the temperature and the period for the vacuum annealing after the formation of the zinc oxide layer were set to 240° C. and 4 minutes, respectively.

Example 8

In Example 8, a solar cell was manufactured and evaluated in the same way as in Example 5 except with the exception that the temperature and the period for the vacuum annealing after the formation of the zinc oxide layer were set to 280° C. and 4 minutes, respectively.

Example 9

In Example 9, a solar cell was manufactured and evaluated in the same way as in Example 5 except with the exception that the annealing was conducted at 240° C. in the air atmosphere for 4 minutes. The annealing under air atmosphere was conducted by introducing the air into the infrared image furnace.

Example 10

In Example 10, a solar cell was manufactured and evaluated in the same way as in Example 1 with the exception that the temperature and the period for forming the zinc oxide layer were set to 170° C. and 15 minutes, respectively. The thickness of the zinc oxide layer was 1300 nm, the top-bottom distance of the irregular structure was 130 nm, and the apex distance of the irregular structure was 0.4 µm. The crystal structure of the zinc oxide was a hexagonal and preferentially oriented along the (11-20) plane direction.

Example 11

In Example 11, a solar cell was manufactured and evaluated in the same way as in Example 1 with the exception that the temperature and the period for forming the zinc oxide layer were set to 210° C. and 8 minutes, respectively. The thickness of the zinc oxide layer was 1300 nm, the top-bottom distance of the irregular structure was 100 nm, and the apex distance of the irregular structure was 0.3 µm. The crystal structure of the zinc oxide was a hexagonal and preferentially oriented along the (10-11) plane direction.

Example 12

In Example 12, a solar cell was manufactured and evaluated in the same way as in Example 1 with the exception that the temperature and the period for forming the zinc oxide layer were set to 260° C. and 25 minutes, respectively. The thickness of the zinc oxide layer was 1300 nm, the top-bottom distance of the irregular structure was 50 nm, and the apex distance of the irregular structure was 0.3 µm. The crystal structure of the zinc oxide was a hexagonal and preferentially oriented along the (10-11) plane direction.

Example 13

In Example 13, a solar cell was manufactured and evaluated in the same way as in Example with the exception that the thickness of the crystalline silicon substrate was changed to 150 µm.

Example 14

In Example 14, a solar cell was manufactured and evaluated in the same way as in Example 1 with the exception that the thickness of the crystalline silicon substrate was changed to 75 µm.

Example 15

In Example 15, a solar cell was manufactured and evaluated in the same way as in Example with the exception that the thickness of the crystalline silicon substrate was changed to 50 µm.

Example 16

In Example 16, a solar cell was manufactured and evaluated in the same way as in Example 1 with the exception that the thickness of the crystalline silicon substrate was changed to 200 µm.

Example 17

In Example 17, a solar cell was manufactured and evaluated in the same way as in Example 1 with the exception that in the formation of the zinc oxide layer, the flow rate ratio of diethylzinc/water/$H_2$/$B_2H_6$ gas was changed to 1/2/25/5. At this time, the carrier density in the zinc oxide layer was $6 \times 10^{19}$ cm$^{-3}$.

Example 18

In Example 18, a solar cell was manufactured and evaluated in the same way as in Example 1 with the exception that in the formation of the zinc oxide layer, the flow rate ratio of diethylzinc/water/$H_2$/$B_2H_6$ gas was changed to 1/2/26/4. At this time, the carrier density in the zinc oxide layer was $5 \times 10^{19}$ cm$^{-3}$.

Example 19

In Example 19, a solar cell was manufactured and evaluated in the same way as in Example 1 with the exception that in the formation of the zinc oxide layer, the flow rate ratio of diethylzinc/water/$H_2$/$B_2H_6$ gas was changed to 1/2/0/30. At this time, the carrier density in the zinc oxide layer was $2 \times 10^{20}$ cm$^{-3}$.

Example 20

In Example 20, a solar cell was manufactured and evaluated in the same way as in Example 1 with the exception that in the formation of the zinc oxide layer, the flow rate ratio of diethylzinc/water/$H_2$/$B_2H_6$ gas was changed to 1/2/0/45. At this time, the carrier density in the zinc oxide layer was $3 \times 10^{20}$ cm$^{-3}$.

Example 21

In Example 21, a solar cell was manufactured and evaluated in the same way as in Example 1 with the exception that in the formation of the zinc oxide layer, the flow rate ratio of diethylzinc/water/$H_2$/$B_2H_6$ gas was changed to 1/2/30/0. At this time, the carrier density in the zinc oxide layer was $4 \times 10^{20}$ cm$^{-3}$.

Example 22

In Example 22, a solar cell was manufactured and evaluated in the same way as in Example 1 with the exception that in the formation of the zinc oxide layer, for 10 minutes from the start of the deposition, the flow rate ratio of diethylzinc/water/$H_2$/$B_2H_6$ gas was set to 1/2/30/0 so that no $B_2H_6$ gas was supplied, and further in the remaining period of 12 minutes (corresponding to a formed thickness of about 600 nm) the flow rate ratio thereof was set to 1/2/20/10, thereby making the dopant concentration in the crystalline silicon substrate side of the zinc oxide layer lower than that in the side of the layer opposite to the crystalline silicon substrate. At this time, the carrier density (average in the thickness direction) in the zinc oxide layer was $6 \times 10^{20}$ cm$^{-3}$.

Comparative Example 1

In Comparative Example 1, a solar cell was manufactured and evaluated in the same way as in Example 1 with the exception that as the transparent conductive layer 4, an ITO layer of 100 nm in thickness was formed by sputtering instead of the formation of the zinc oxide layer. The surface of the ITO layer had an irregular structure having a top-bottom distance of 5 nm, which was substantially flat. Thus, fine irregularities as formed in Example 1 were not formed.

Comparative Example 2

In Comparative Example 2, a solar cell was manufactured and evaluated in the same way as in Example 1 with the exception that the period for forming the light-incident-side transparent conductive layer was changed to 2 minutes. The thickness of the zinc oxide layer was 100 nm, and the surface form thereof was substantially flat. Thus, fine irregularities were not formed.

Comparative Example 3

In Comparative Example 3, a solar cell was manufactured and evaluated in the same way as in Example 1 with the exception that the period for forming the light-incident-side transparent conductive layer was changed to 35 minutes.

Comparative Example 4

In Comparative Example 4, a solar cell was manufactured and evaluated in the same way as in Example 1 with the exception that the temperature and the period for forming the zinc oxide layer were changed to 110° C. and 40 minutes, respectively. The thickness of the zinc oxide layer was 1300 nm, the top-bottom distance of the irregular structure was 15 nm, and the apex distance of the irregular structure was 0.4 μm. The crystal structure of the zinc oxide was evaluated by the X-ray diffraction method. As a result, only a diffraction peak based on its (0002) plane was observed, so that the lattice constant along the a-axis was unable to be evaluated.

Comparative Example 5

In Comparative Example 5, a solar cell was manufactured and evaluated in the same way as in Example 1 with the exception that as the transparent conductive layer 4, a zinc oxide layer having a thickness of 1000 nm was formed by sputtering instead of the formation of the zinc oxide layer by the CVD. The surface form of this zinc oxide layer was substantially flat. Thus, fine irregularities were not formed. The surface of this zinc oxide layer was etched to form an irregular structure. The top-bottom distance of the irregular structure of the zinc oxide layer was 120 nm, and the apex distance of the irregular structure was 0.5 μm. The crystal structure of the zinc oxide was evaluated by the X-ray diffraction method. As a result, only a diffraction peak based on its (0002) plane was observed, so that the lattice constant along the a-axis was unable to be evaluated.

Comparative Example 6

In Comparative Example 6, a solar cell was manufactured and evaluated in the same way as in Example 5 with the exception that the temperature and the period for the vacuum annealing after the formation of the zinc oxide layer were changed to 320° C. and 4 minutes, respectively.

Comparative Example 7

In Comparative Example 7, a solar cell was manufactured and evaluated in the same way as in Example 1 with the exception that the temperature and the period for forming the zinc oxide layer were changed to 300° C. and 29 minutes, respectively. The thickness of the zinc oxide layer was 1300 nm, the top-bottom distance of the irregular structure was 50 nm, and the apex distance of the irregular structure was 0.3 μm. The crystal structure of the zinc oxide was a hexagonal crystal oriented preferentially into the direction of its (10-11) plane.

Comparative Example 8

In Comparative Example 8, an attempt for manufacturing and evaluating a solar cell was made in the same way as in Example 1 with the exception that the thickness of the crystalline silicon substrate was changed to 40 μm. At this time, the silicon substrate was very easily broken; thus, a measurable solar cell was unable to be manufactured.

In Table 1, the structure of each of the solar cells of the examples and the comparative examples, and the warp amount of its substrate before the formation of its electrodes are shown. In Table 2, the photoelectric conversion characteristics of the solar cell after the formation of the electrodes, the warp amount thereof, and the adhesion force of the collector electrode are shown.

TABLE 1

| | Si | Conditions for forming transparent conductive layer | | | Transparent conductive layer characteristics | | | | | | | | |
|---|---|---|---|---|---|---|---|---|---|---|---|---|---|
| | Substrate thickness (μm) | Deposition temperature (°C.) | Deposition period (minutes) | Annealing conditions | D (nm) | H2 (nm) | L2 (μm) | Carrier density (×10$^{19}$ cm$^{-3}$) | Preferred orientation plane | $a_{ZnO}$ (nm) | S (nm$^2$) | W (×10$^{-5}$ nm) | Warp amount (mm) |
| Example 1 | 100 | 150 | 22 | — | 1300 | 180 | 0.6 | 8 | (11-20) | 0.3236 | 1.69 | 1.69 | 0.6 |
| Example 2 | 100 | 150 | 27 | — | 2000 | 260 | 0.8 | 8 | (11-20) | 0.3237 | 2.40 | 2.40 | 0.8 |
| Example 3 | 100 | 150 | 18 | — | 800 | 120 | 0.4 | 8 | (10-10) | 0.3234 | 1.20 | 1.20 | 0.4 |
| Example 4 | 100 | 150 | 11 | — | 300 | 80 | 0.3 | 8 | (10-10) | 0.3231 | 0.54 | 0.54 | 0.2 |
| Example 5 | 100 | 150 | 22 | 180° C. | 1300 | 180 | 0.6 | 8 | (11-20) | 0.3239 | 1.30 | 1.30 | 0.5 |
| Example 6 | 100 | 150 | 22 | 200° C. | 1300 | 180 | 0.6 | 8 | (11-20) | 0.3242 | 0.91 | 0.91 | 0.3 |
| Example 7 | 100 | 150 | 22 | 240° C. | 1300 | 180 | 0.6 | 8 | (11-20) | 0.3244 | 0.65 | 0.65 | 0.2 |
| Example 8 | 100 | 150 | 22 | 280° C. | 1300 | 180 | 0.6 | 7 | (11-20) | 0.3247 | 0.26 | 0.26 | 0.1 |
| Example 9 | 100 | 150 | 22 | 240° C. (air atmosphere) | 1300 | 180 | 0.6 | 2.5 | (11-20) | 0.3245 | 0.52 | 0.52 | 0.2 |
| Example 10 | 100 | 170 | 15 | — | 1300 | 130 | 0.4 | 8 | (11-20) | 0.3230 | 2.47 | 2.47 | 0.9 |
| Example 11 | 100 | 210 | 8 | — | 1300 | 100 | 0.3 | 5 | (10-11) | 0.3229 | 2.60 | 2.60 | 0.9 |
| Example 12 | 100 | 260 | 25 | — | 1300 | 50 | 0.3 | 4 | (10-11) | 0.3227 | 2.86 | 2.86 | 1.0 |
| Example 13 | 150 | 150 | 22 | — | 1300 | 180 | 0.6 | 8 | (11-20) | 0.3236 | 1.69 | 1.13 | 0.4 |
| Example 14 | 75 | 150 | 22 | — | 1300 | 180 | 0.6 | 8 | (11-20) | 0.3236 | 1.69 | 2.25 | 0.8 |
| Example 15 | 50 | 150 | 22 | — | 1300 | 180 | 0.6 | 8 | (11-20) | 0.3236 | 1.69 | 3.38 | 1.2 |
| Example 16 | 200 | 150 | 22 | — | 1300 | 180 | 0.6 | 8 | (11-20) | 0.3236 | 1.69 | 0.85 | 0.3 |
| Example 17 | 100 | 150 | 22 | — | 1300 | 180 | 0.6 | 6 | (11-20) | 0.3236 | 1.69 | 1.69 | 0.6 |
| Example 18 | 100 | 150 | 22 | — | 1300 | 180 | 0.6 | 5 | (11-20) | 0.3236 | 1.69 | 1.69 | 0.6 |
| Example 19 | 100 | 150 | 22 | — | 1300 | 180 | 0.6 | 20 | (11-20) | 0.3236 | 1.69 | 1.69 | 0.6 |
| Example 20 | 100 | 150 | 22 | — | 1300 | 180 | 0.6 | 30 | (11-20) | 0.3236 | 1.69 | 1.69 | 0.6 |
| Example 21 | 100 | 150 | 22 | — | 1300 | 180 | 0.6 | 40 | (11-20) | 0.3236 | 1.69 | 1.69 | 0.6 |
| Example 22 | 100 | 150 | 22 | — | 1300 | 180 | 0.6 | 6 | (11-20) | 0.3236 | 1.69 | 1.69 | 0.6 |
| Comparative Example 1 | 100 | — | — | — | 100 | — | — | — | — | — | — | — | 0 |
| Comparative Example 2 | 100 | 150 | 2 | — | 100 | — | — | — | (11-20) | 0.3226 | 0.23 | 0.23 | 0.1 |
| Comparative Example 3 | 100 | 150 | 35 | — | 2700 | 300 | 1 | 8 | (11-20) | 0.3238 | 2.97 | 2.97 | 1.1 |
| Comparative Example 4 | 100 | 110 | 40 | — | 1300 | 15 | 0.1 | 8 | (0002) | — | — | — | 0.6 |
| Comparative Example 5 | 100 | — | — | — | 1000 | 120 | 0.5 | — | (0002) | — | — | — | 0 |
| Comparative Example 6 | 100 | 150 | 22 | 320° C. | 1300 | 180 | 0.6 | 2 | (11-20) | 0.3251 | -0.26 | -0.26 | -0.1 |
| Comparative Example 7 | 100 | 300 | 29 | — | 1300 | 50 | 0.3 | 4 | (10-11) | 0.3223 | 3.38 | 3.38 | 1.2 |
| Comparative Example 8 | 40 | 150 | 22 | — | 1300 | 180 | 0.6 | — | | | | | |

TABLE 2

| | Voc (mV) | Jsc (mA/cm$^2$) | F.F. (%) | Eff. (%) | Adhesive strength | Warp amount (mm) |
|---|---|---|---|---|---|---|
| Example 1 | 729 | 35.2 | 76.5 | 19.6 | 4 | -0.5 |
| Example 2 | 729 | 34.5 | 77.2 | 19.4 | 4 | -0.3 |
| Example 3 | 729 | 34.8 | 76.5 | 19.4 | 3 | -0.7 |
| Example 4 | 729 | 34.4 | 75.2 | 18.9 | 2 | -0.9 |
| Example 5 | 731 | 35.1 | 76.9 | 19.7 | 4 | -0.6 |
| Example 6 | 731 | 35.1 | 77.0 | 19.8 | 4 | -0.8 |
| Example 7 | 729 | 35.1 | 77.2 | 19.8 | 4 | -0.9 |
| Example 8 | 720 | 34.8 | 74.4 | 18.6 | 4 | -1.0 |
| Example 9 | 728 | 35.3 | 74.4 | 19.1 | 4 | -0.9 |
| Example 10 | 730 | 34.8 | 75.2 | 19.1 | 3 | -0.2 |
| Example 11 | 720 | 34.4 | 75.2 | 18.6 | 2 | -0.2 |
| Example 12 | 710 | 34.4 | 71.4 | 17.5 | 2 | -0.1 |
| Example 13 | 714 | 35.1 | 75.2 | 18.9 | 4 | -0.3 |
| Example 14 | 738 | 34.8 | 75.2 | 19.3 | 4 | -0.7 |
| Example 15 | 744 | 34.4 | 75.2 | 19.3 | 4 | -1.0 |
| Example 16 | 719 | 35.1 | 77.2 | 19.5 | 4 | -0.8 |
| Example 17 | 729 | 34.8 | 76.0 | 19.3 | 4 | -0.5 |
| Example 18 | 730 | 34.8 | 74.4 | 18.9 | 4 | -0.5 |
| Example 19 | 729 | 34.4 | 75.2 | 18.9 | 4 | -0.5 |
| Example 20 | 729 | 33.4 | 75.2 | 18.3 | 4 | -0.5 |
| Example 21 | 719 | 33.8 | 76.5 | 18.6 | 4 | -0.5 |
| Example 22 | 731 | 35.3 | 76.3 | 19.7 | 4 | -0.5 |
| Comparative Example 1 | 709 | 34.1 | 75.2 | 18.2 | 1 | -1.1 |

TABLE 2-continued

|  | Voc (mV) | Jsc (mA/cm$^2$) | F.F. (%) | Eff. (%) | Adhesive strength | Warp amount (mm) |
|---|---|---|---|---|---|---|
| Comparative Example 2 | 709 | 34.1 | 75.2 | 18.2 | 2 | −1.1 |
| Comparative Example 3 | 729 | 33.9 | 77.2 | 19.1 | 4 | 0.0 |
| Comparative Example 4 | 720 | 33.1 | 75.3 | 17.9 | 1 | −0.5 |
| Comparative Example 5 | 709 | 35.1 | 75.4 | 18.8 | 3 | −1.1 |
| Comparative Example 6 | 702 | 33.1 | 71.4 | 16.6 | 4 | −1.2 |
| Comparative Example 7 | 699 | 34.8 | 69.4 | 16.9 | 4 | 0.1 |

[Warp Evaluation Results]

In Comparative Example 1, wherein the ITO having thickness of 100 μm was formed as the light-incident-side transparent conductive layer, and Comparative Example 5, wherein the zinc oxide layer was formed by sputtering, the substrate was not warped after the formation of the transparent conductive layer; however, after the formation of the metal electrode layer, the substrate was warped to give a warp amount having an absolute value more than 1 mm. In Comparative Example 2, wherein the thickness of the zinc oxide layer was as small as 100 nm, and Comparative Example 6, wherein the zinc oxide layer was annealed at high temperature, the same tendency was observed.

In Comparative Example 3, wherein the thickness of the zinc oxide layer was as large as 2700 nm, and Comparative Example 2, wherein the lattice constant along the a-axis of the zinc oxide was small since the temperature for the thermal CVD in the formation of the zinc oxide layer was as high as 300° C., the warp was small after the formation of the metal electrode layer; however, the warp was large after the formation of the zinc oxide layer. In the mass production of such solar cells, it appears that in the steps from the end of the formation of the zinc oxide layer to the formation of the metal electrode layer, inconveniences due to the warped substrate will be easily caused.

While, in Examples 1 to 12 and Examples 17 to 20, in each of which the silicon substrate of 100 μm in thickness was used in the same way as in Comparative Examples 1 to 7, a warp toward the plus direction was generated when the transparent conductive layer was formed. However, this warp was balanced with a minus direction warp based on the formation of the metal electrode, thereby inhibiting the warp of the solar cell into a small level.

Figure 9:
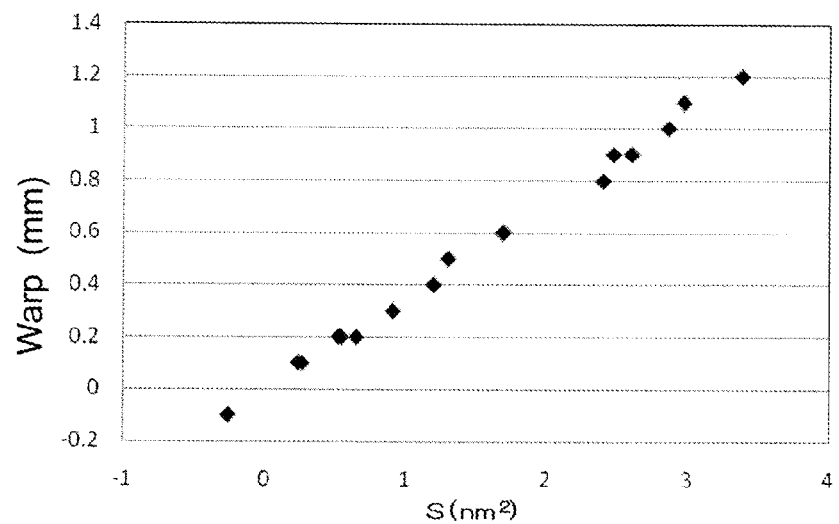
FIG. 9 is a graph showing a relationship between the stress strain parameter S of each of the examples and comparative examples, and the warp amount of its substrate.

The stress strain parameter of the zinc oxide layer of each of Examples 1 to 12, Examples 17 to 20, and Comparative Examples 2, 3, 6 and 7, wherein the zinc oxide layer was formed by thermal CVD, is plotted along its transverse axis, and the warp amount of the substrate after the formation of the transparent conductive layer is plotted along its vertical axis. The resulting graph is shown in FIG. 9. As is evident from FIG. 9, when the thickness of the silicon substrate is not varied, the warp amount of the substrate after the formation of the transparent conductive layer has a linear relationship with the stress strain parameter S of the zinc oxide layer. Thus, as the stress strain parameter increases, the warp amount increases steadily. It is understood that by adjusting the stress strain parameter of the zinc oxide layer in this way, the warp amount of the substrate is adjusted after the formation of the transparent conductive layer, and the warp is caused to be balanced with stress based on the metal electrode layer, thereby making it possible to decrease a warp in the solar cell.

A comparison is made between Examples 1, and 13 to 15, wherein the conditions for forming the zinc oxide layer as the transparent conductive layer are not varied but the silicon substrate is varied in thickness, there is observed a tendency that as the silicon substrate thickness is smaller, the warp amount parameter W is larger so that the warp amount becomes larger after the formation of the transparent conductive layer. On the other hand, as the substrate thickness is smaller, the amount of a change in the warp amount is also larger before and after the formation of the metal electrode layer. It is therefore understood that even in a case where the substrate thickness is small, stresses on the front and backsides of the silicon substrate are balanced with each other when the stress strain parameter S is in the above-mentioned range, so that the solar cell can be finally inhibited from being warped. However, if the thickness of the silicon substrate is too small, the silicon substrate itself is easily cracked and further the warp amount parameter W becomes too large. As a result, there may be caused an inconvenience that no solar cell can be manufactured as in Comparative Example 8.

[Evaluation Results of Photoelectric Conversion Characteristics]

In Examples 1 to 19, the short circuit current density is improved from that in Comparative Example 1, wherein the ITO of 100 μm in thickness is formed as the light-incident-side transparent conductive layer. It is presumed from this fact that although the thickness of the light-incident-side transparent conductive layer is large in the invention so that an absorption loss is caused, the light scattering effect based on the formation of the fine irregular structure in the surface of the zinc oxide layer exceeds the disadvantage based on the absorption loss, so that the short circuit current density is raised. Attention should be paid to the following: also in Examples 14 and 15, in each of which the silicon substrate smaller in thickness than that in Comparative Example 1 is used, a higher short circuit current density is obtained than in Comparative Example 1.

When Examples 1, and 10 to 12 are compared with Comparative Example 1, it is understood that the use of the zinc oxide produced by thermal CVD can give a higher open circuit voltage than that of the zinc oxide or ITO formed by sputtering. One of the critical determinations of the open circuit voltage and the fill factor is interfacial situations (such as the trap density and the junction barrier height) between the conductivity type silicon based thin film layer and the transparent conductive layer. The interfacial state between the conductivity type silicon based thin film layer and the transparent conductive layer is varied in accordance with the material of the transparent conductive layer or conditions for forming the layers. It is therefore demonstrated that when zinc oxide is formed as the transparent conductive layer by thermal CVD, a good interface can be formed between the zinc oxide layer and the conductivity type silicon based thin film layer.

Detailed reasons why such a good interface is formed are not necessarily clear; however, it is assumed that the reasons are as follows: when the zinc oxide layer is formed, the underlying layer thereof, i.e., the conductivity type silicon based thin film layer is inhibited from being damaged; from the initial stage of the growth of the crystal, this zinc oxide layer is formed so as to have good properties; and when the layer is formed, the conductivity type silicon based thin film layer and the other layers are annealed. In the invention, the solar cell is improved not only in short circuit current but also in open circuit voltage to realize a high conversion efficiency.

From a comparison between Examples 1 and Examples 13 to 16, it is understood that the open circuit voltage is also varied in accordance with the thickness of the silicon substrate. This appears to correspond to the fact that as the thickness of the silicon substrate is smaller, the number of defects in the silicon substrate is decreased so that a loss in the silicon substrate is reduced.

By contrast, in Comparative Example 5, wherein the zinc oxide layer is formed by sputtering and the irregular structure is formed by etching, the irregular structure is formed on the transparent conductive layer surface so that this solar cell is substantially equivalent in short circuit current density to that of Example 1. However, Comparative Example 5 is equivalent in open circuit voltage to Comparative Example 1. These results demonstrate that the open circuit voltage is varied in accordance with interfacial situations between the conductivity type silicon based thin film layer and the transparent conductive layer, and the open circuit voltage is not increased by the irregular structure in the transparent conductive layer surface.

From a comparison between the examples and the comparative examples, when the zinc oxide layer is preferentially oriented along the (10-10) plane direction, the (11-20) plane direction or the (10-11) plane direction, the adhesion force between the zinc oxide layer and the collector electrode tends to be higher than when the zinc oxide layer is preferentially oriented along the (0002) plane direction. In particular, when the zinc oxide layer is preferentially oriented along the (11-20) plane direction, a tendency that the increase of adhesion force is large can be observed.

A comparison is made between Examples 1 to 4 and Comparative Examples 2 and 3, wherein the conditions for forming the zinc oxide layer by thermal CVD are not varied, and only the deposition period for the zinc oxide layer (the thickness of the layer) is varied. As the thickness of the zinc oxide layer is larger, the top-bottom distance H2 of the irregular structure is larger and the adhesion force of the collector electrode is improved. By contrast, even when the thickness of the zinc oxide layer is made too large as in Comparative Example 3, the adhesion force of the collector electrode is not improved and additionally this solar cell tends to be lowered in short circuit current density and open circuit voltage to be declined in conversion efficiency.

A comparison is made between Examples 1 and 5 to 10, and Comparative Example 6. It is understood that the vacuum annealing after the formation of the zinc oxide layer makes an improvement of the cell in photoelectric conversion characteristics; however, if the annealing temperature is too high, the photoelectric conversion characteristics tend to fall. It is also understood that in Example 9, the annealing is conducted in the air atmosphere; thus, the carrier density is decreased so that the fill factor is lowered. From such results, it is understood that a high conversion efficiency is obtained by performing the annealing at the specific temperature under reduced pressure.

A comparison is made between Examples 1 and 10 to 12, and Comparative Examples 4 and 7, wherein the temperature for forming the zinc oxide layer by thermal CVD is varied. In Examples 1, 10 and 11, the zinc oxide layer is preferentially oriented along the (11-20) plane direction. In Examples 12 and 13, and Comparative Example 3, wherein the deposition temperature is higher, the zinc oxide tends to be preferentially oriented along the (10-11) plane direction. As the deposition temperature is raised, the top-bottom distance H2 of the irregularities tends to be increased. On the other hand, it is understood that in Comparative Example 4, wherein the deposition temperature is lower than 120° C., the zinc oxide is preferentially oriented along the (0002) plane direction; and irregularity permitting the generation of effective light scattering are not formed.

A comparison is made between Examples 1 and 17 to 21, wherein the ratio between the gas amounts supplied is varied in the formation of the zinc oxide layer. It is understood that when the carrier density in the zinc oxide layer is low, the fill factor tends to be lowered, and when the carrier density is high, the short circuit current density tends to be lowered; and the carrier density is preferably from $3 \times 10^{19}$ to $2.5 \times 10^{20}$ $cm^{-3}$. When a comparison is made between Examples 1 and 21, it is understood that a high conversion efficiency is obtained by making the dopant concentration in the crystalline silicon substrate side of the transparent conductive layer lower than that in the side of the zinc oxide layer that is opposite to the crystalline silicon substrate.

DESCRIPTION OF REFERENCE CHARACTERS

| | |
|---|---|
| 1 | crystalline silicon substrate |
| 2 | i-type silicon based thin film layer |
| 3 | conductivity type silicon based thin film layer |
| 4 | transparent conductive layer |
| 5 | collector electrode |
| 6 | i-type silicon based thin film layer |
| 7 | conductivity type silicon based thin film layer |
| 8 | transparent conductive layer |
| 10 | metal electrode layer |
| 11 | crystalline silicon based solar cell |
| 12 | filler |
| 13 | substrate |
| 14 | substrate |

The invention claimed is:

1. A crystalline silicon based solar cell, comprising:
a crystalline silicon substrate of one conductivity type having a light-incident-side main surface and an other main surface side opposite the light-incident side;
a light-incident-side i-type silicon based thin film layer, a silicon based thin film layer of a conductivity type opposite the one conductivity type, a light-incident-side transparent conductive layer, and a collector electrode that are formed over the light-incident-side main surface of the crystalline silicon substrate in this order from the light-incident-side main surface; and
a back-side i-type silicon based thin film layer, a silicon based thin film layer of the one conductivity type, a back-side transparent conductive layer, and a metal electrode layer that are formed over the other main surface side of the crystalline silicon substrate in this order from the other main surface side,
wherein the crystalline silicon substrate has a thickness of 50 to 200 μm, and has a rough structure on at least the light-incident-side main surface thereof,
a light-incident-side surface of the light-incident-side transparent conductive layer has an irregular structure, a top-bottom distance of the irregular structure of the light-incident-side transparent conductive layer is smaller than a top-bottom distance of the light-incident-side rough structure of the light-incident-side main surface of the crystalline silicon substrate,
an apex distance of the irregular structure of the light-incident-side transparent conductive layer is smaller than an apex distance of the light-incident-side rough structure of the light-incident-side main surface of the crystalline silicon substrate, the light-incident-side transparent conductive layer comprises a zinc oxide layer having a thickness of 300 to 2500 nm, the zinc oxide layer comprises hexagonal zinc oxide preferentially oriented along a (10-10) plane direction, a (11-20) plane direction, or a (10-11) plane direction, and the hexagonal zinc oxide has a lattice constant in a range from 0.3225 nm to 0.3246 nm along an a-axis.

2. The crystalline silicon based solar cell according to claim 1, wherein the top-bottom distance of the irregular structure in the light-incident-side main surface of the crystalline silicon substrate is from 20 nm to 250 nm.

3. The crystalline silicon based solar cell according to claim 1, wherein the top-bottom distance of the rough structure in the light-incident-side main surface of the crystalline silicon substrate is from 0.5 μm to 40 μm.

4. The crystalline silicon based solar cell according to claim 1, wherein the zinc oxide layer has a stress strain parameter $S=(a_{ZnO}-0.3249) \times d_{ZnO}$, in a range from 0.3 nm² to 2.9 nm², wherein $a_{ZnO}$ represents a lattice constant of the zinc oxide along an a-axis, and $d_{ZnO}$ represents a thickness of the zinc oxide layer, and all of the parameters are measured in nanometers.

5. The crystalline silicon based solar cell according to claim 1, wherein the zinc oxide layer has a warp amount parameter $W=(a_{ZnO}-0.3249) \times d_{ZnO}/d_{Si}$ in a range from $0.3 \times 10^{-5}$ nm to $2.9 \times 10^{-5}$ nm, wherein $a_{ZnO}$ represents a lattice constant of the zinc oxide along an a-axis, $d_{ZnO}$ represents a thickness of the zinc oxide layer, and $d_{Si}$ represents a thickness of the silicon substrate, and all of the parameters are measured in nanometers.

6. The crystalline silicon based solar cell according to claim 1, wherein an impurity concentration in the crystalline silicon substrate side of the zinc oxide layer is lower than an impurity concentration in an opposite side of the crystalline silicon substrate side of the zinc oxide layer.

7. The crystalline silicon based solar cell according to claim 1, wherein a carrier density of the zinc oxide layer is from $3 \times 10^{19}$ cm$^{-3}$ to $2.5 \times 10^{20}$ cm$^{-3}$.

8. A manufacturing method of a crystalline silicon based solar cell comprising:
a silicon substrate preparing step of preparing a silicon crystalline substrate of one conductivity type having a thickness of 50 μm to 200 μm and having a rough structure on at least one light-incident-side main surface thereof;
a light-incident-side silicon based thin film deposition step of forming a light-incident-side i-type silicon based thin film layer and a silicon based thin film layer of a conductivity type opposite the one conductivity type in this order over the rough structure formed surface of the light-incident-side main surface silicon crystalline substrate;
a back-side silicon based thin film layer forming step of forming a back-side i-type silicon based thin film layer and a silicon based thin film layer of the one conductivity type in this order, over an other surface opposite the light-incident-side main surface of the silicon crystalline substrate;
a light-incident-side transparent conductive layer forming step of forming a light-incident-side transparent conductive layer over the opposite-conductivity-type silicon based thin film layer side surface of the light-incident-side main surface of the silicon crystalline substrate;
a back-side transparent conductive layer forming step of forming a back-side transparent conductive layer over the one-conductivity-type silicon based thin film layer side surface of the other surface opposite the light-incident-side main surface of the silicon crystalline substrate;
a collector electrode forming step of forming a collector electrode over the light-incident-side transparent conductive layer;
and a metal electrode layer forming step of forming a metal electrode layer over the back-side transparent conductive layer,
wherein, in the light-incident-side transparent conductive layer forming step, a zinc oxide layer having a thickness of 300 to 2500 nm is formed by thermal CVD, such that the zinc oxide layer comprises hexagonal zinc oxide having a lattice constant in the range from 0.3225 nm to 0.3246 nm along an a-axis and being preferentially oriented along a (10-10) plane direction, a (11-20) plane direction, or a (10-11) plane direction.

9. The method for manufacturing a crystalline silicon based solar cell according to claim 8, wherein a deposition temperature for the zinc oxide layer includes a range of 120 to 240° C.

10. The method for manufacturing a crystalline silicon based solar cell according to claim 8, further comprising a zinc oxide layer annealing step after the zinc oxide layer is formed by the thermal CVD,
wherein a substrate over which the zinc oxide layer is formed is heated to a temperature of 150 to 240° C. in the zinc oxide layer annealing step.

11. The method for manufacturing a crystalline silicon based solar cell according to claim 10, wherein the annealing step is conducted under reduced pressure.

* * * * *

UNITED STATES PATENT AND TRADEMARK OFFICE
CERTIFICATE OF CORRECTION

PATENT NO.        : 8,546,685 B2
APPLICATION NO.   : 13/381610
DATED             : October 1, 2013
INVENTOR(S)       : Daisuke Adachi et al.

It is certified that error appears in the above-identified patent and that said Letters Patent is hereby corrected as shown below:

In the Claims

At Column 36, line 2, Claim 8 insert --of-- after surface.

At Column 36, line 44, Claim 10 delete "." after C.

Signed and Sealed this
Seventeenth Day of December, 2013

Margaret A. Focarino
*Commissioner for Patents of the United States Patent and Trademark Office*